US00RE47530E

(19) United States
(12) Reissued Patent
Kadotani et al.

(10) Patent Number: US RE47,530 E
(45) Date of Reissued Patent: *Jul. 23, 2019

(54) LIGHT-EMITTING DIODE APPARATUS

(71) Applicants: CITIZEN ELECTRONICS CO., LTD., Yamanashi (JP); CITIZEN WATCH CO., LTD., Tokyo (JP)

(72) Inventors: Norikazu Kadotani, Tsu (JP); Koichi Fukasawa, Fuefuki (JP); Sadato Imai, Minamitsuru-Gun (JP)

(73) Assignees: CITIZEN ELECTRONICS CO., LTD., Yamanashi (JP); CITIZEN WATCH CO., LTD., Tokyo (JP)

( * ) Notice: This patent is subject to a terminal disclaimer.

(21) Appl. No.: 15/336,285

(22) Filed: Oct. 27, 2016

Related U.S. Patent Documents

Reissue of:
(64) Patent No.: 8,258,522
Issued: Sep. 4, 2012
Appl. No.: 12/821,345
Filed: Jun. 23, 2010

U.S. Applications:
(63) Continuation of application No. 14/476,221, filed on Sep. 3, 2014, now Pat. No. Re. 46,295, which is an application for the reissue of Pat. No. 8,258,522.

(30) Foreign Application Priority Data

Jun. 23, 2009 (JP) ..... 2009-148996

(51) Int. Cl.
*H01L 33/00* (2010.01)
*F21K 9/00* (2016.01)
(Continued)

(52) U.S. Cl.
CPC ..... *F21K 9/00* (2013.01); *F21V 29/76* (2015.01); *H01L 25/0753* (2013.01);
(Continued)

(58) Field of Classification Search
CPC ..... F21K 9/00; F21V 29/76; H01L 25/0753; H01L 33/62; H05K 1/021; H05K 1/0259
(Continued)

(56) References Cited

U.S. PATENT DOCUMENTS 6,596,016 B1 7/2003 Vreman et al.
6,638,780 B2 10/2003 Fukasawa et al.
(Continued)

FOREIGN PATENT DOCUMENTS

JP 2006295085 10/2006
JP 2006295085 A 10/2006
(Continued)

OTHER PUBLICATIONS

Chinese Office Action for Chinese Application No. 201510194031.X, dated Feb. 28, 2017 with translation, 15 pages.
(Continued)

*Primary Examiner* — Angela M Lie
(74) *Attorney, Agent, or Firm* — RatnerPrestia

(57) ABSTRACT

An LED apparatus includes a base having thermal conductivity, an insulative substrate provided on one surface of the base and including electrodes provided on a surface of the substrate, at least one base-mounting area that is an exposed part of the base, exposed within a pass-through hole provided in the substrate, a plurality of LED elements mounted on the base in the base-mounting area and some of the LED elements in a unit electrically connected to the electrodes in series, a plurality of the units are electrically connected in parallel, and a frame disposed to surround the base-mounting area and configured to form a light-emitting area.

15 Claims, 18 Drawing Sheets

(51) Int. Cl.

| | |
|---|---|
| ***F21V 29/76*** | (2015.01) |
| *H01L 25/075* | (2006.01) |
| *H05K 1/02* | (2006.01) |
| *H01L 33/62* | (2010.01) |

(52) U.S. Cl.
CPC .... *H01L 33/62* (2013.01); *H01L 2224/48137* (2013.01); *H05K 1/021* (2013.01); *H05K 1/0259* (2013.01); *H05K 2201/10106* (2013.01)

(58) Field of Classification Search
USPC ..... 257/88, 80; 438/22
See application file for complete search history.

(56) References Cited

U.S. PATENT DOCUMENTS

| | | | | |
|---|---|---|---|---|
| 7,439,549 | B2 | 10/2008 | Marchl et al. | |
| 7,521,728 | B2 | 4/2009 | Andrews | |
| 7,524,085 | B2 | 4/2009 | Bedson et al. | |
| 7,686,470 | B2 | 3/2010 | Chiang | |
| 7,939,919 | B2 * | 5/2011 | Hsieh | 257/675 |
| 8,222,116 | B2 | 7/2012 | Jinbo | |
| 9,502,624 | B2 | 11/2016 | Kuramoto et al. | |
| 2002/0139987 | A1 | 10/2002 | Collins, III et al. | |
| 2004/0065894 | A1 | 4/2004 | Hashimoto | |
| 2004/0208210 | A1 | 10/2004 | Inoguchi | |
| 2007/0187701 | A1 * | 8/2007 | Goon et al. | 257/88 |
| 2008/0231169 | A1 | 9/2008 | Hata | |
| 2009/0140285 | A1 | 6/2009 | Lin | |
| 2010/0046220 | A1 | 2/2010 | Fukasawa et al. | |

FOREIGN PATENT DOCUMENTS

| | | |
|---|---|---|
| JP | 2009010050 A | 1/2009 |
| JP | 2009135440 | 6/2009 |
| JP | 2009140717 | 6/2009 |
| WO | 2006132795 | 12/2006 |

OTHER PUBLICATIONS

German Office Action and English translation for DE 10 2010 030 336.4, issued Jul. 23, 2014 and received Jul. 8, 2014.
Chinese 1st Notification of Office Action and English translation for CN 201010212330.9, issued Dec. 3, 2013.
Chinese 2nd Notification of Office Action and English translation for CN 201010212330.9, issued Sep. 5, 2014.

* cited by examiner

LIGHT-EMITTING DIODE APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO THE RELATED APPLICATION

*Notice: More than one reissue application has been filed for the reissue of U.S. Pat. No. 8,258,522. This application is a reissue continuation of application Ser. No. 14/476,221 and a reissue of U.S. Pat. No. 8,258,522.*

This application *is an application for reissue of U.S. Pat. No. 8,258,522 and claims benefit under 35 U.S.C. 120 as a continuation of application Ser. No. 14/476,221, which is an application for reissue of U.S. Pat. No. 8,258,522, which* is based on and claims the priority benefit of Japanese Patent Application No. 2009-148996, filed on Jun. 23, 2009, the [disclosure] *disclosures* of [which is] *each of these applications being* incorporated herein by reference in [its entirety] *their entireties*.

BACKGROUND OF THE INVENTION

1. Field of the Invention

The present invention relates to an LED (light-emitting diode) apparatus formed by collecting a plurality of LED elements to be capable of using as various illumination light sources.

2. Description of the Related Art

Conventional LED elements which are compound semiconductors have widely been utilized as light source devices, using characteristics of a long service life and miniaturization. Manufacturing light source devices to emit light of white color or pseudo white color has been promoted with development of blue-LED elements formed by gallium nitride-system-compound semiconductors and so on. In addition, light source devices having high output and high brightness in which heat-release of LED elements is devised have been manufactured.

On the other hand, because there is a limitation to light intensity in one LED element, there have been disclosed collecting-type LEDs or LED light-source units capable of obtaining much light intensity by mounting a plurality of LED elements on one substrate and lighting these LED elements (for reference, see Japanese Patent Application Publication No. 2006-295085 (page 3 of the specification and FIG. 1).

FIG. 18 illustrates a conventional typical LED light-source unit 100. The LED light-source unit 100 includes an elongate insulative substrate 101, a plurality of LED elements 110 arranged on a surface of the insulative substrate 101 in line at intervals in a longitudinal direction of the substrate, and a metallic plate and so on (not shown) fixed to another surface of the insulative substrate 101. The insulative substrate 101 has at opposite sides thereof two electrode terminals 102a and 102b. Electrodes 104 are formed to extend from the electrode terminals 102a and 102b along an array of the LED elements 110. Connection electrodes 103a and 103b are provided on the electrodes 104 adjacent to each of the LED elements 110.

Each of the plurality of LED elements 110 is connected through wires 111 to the adjacent connection electrodes 103a and 103b. Thereby, the LED elements 110 are connected parallel to the electrode terminals 102a and 102b. When a drive voltage is applied to the electrode terminals 102a and 102b, a drive current flows in each of the LED elements 110, all the LED elements 110 are concurrently lighted. The LED elements 110 are sealed by a seal member 105 so that they are electrically and mechanically protected.

In the conventional LED light-source unit, because the plurality of LED elements can be arranged in a manner of array and lighted simultaneously, it is possible to acquire a relatively great light intensity. In addition, in the conventional LED light-source unit, it is shown that various types of light sources can easily be formed by arranging a plurality of light-source units in a line state or dimensionally.

However, in the aforementioned conventional LED light-source unit, because the LED elements are arranged in line, and a light-emitting area has an elongate rectangular shape, there is a problem that an optical design is difficult for the fact that light emitted from the LED elements must be collected. Alternatively, if approximately a square light-emitting area is formed by arranging a plurality of LED light-source units, an easy optical design is obtained. However, because a gap tends to occur between the plurality of LED light-source units which are separate, increasing density of mounting the LED elements is difficult, there is a limitation to acquire a light-source device having high lumen-density (all light-flux density).

Here, in a general light source, if it has high lumen-density, the light source is very effective to perform an optical design such as a lens and so on for collecting emitted light, and an excellent light source having high output, high brightness and high light-emitting efficiency can easily be accomplished. Therefore, a light-source device having high lumen-density as various light sources for illumination are increasingly needed.

SUMMARY OF THE INVENTION

An object of the present invention is to provide an LED apparatus capable of acquiring a light-source device having entirely high lumen-density with an easy optical design and a small light-emitting part.

To accomplish the above object, an LED apparatus according to an embodiment of the present invention includes a base including an upper surface, a lower surface opposite the upper surface and a peripheral edge side surface provided between the upper surface and the lower surface and having thermal conductivity, an insulative substrate including an upper surface provided with electrodes, a lower surface opposite the upper surface and a pass-through hole provided to pass through the upper surface and the lower surface, the lower surface of the insulative substrate being attached to the upper surface of the base, at least one base-mounting area that is an exposed part of the upper surface of the base, exposed within the pass-through hole of the substrate, a plurality of LED elements mounted on the base-mounting area and electrically connected with respect to one another and electrodes which are provided along opposite sides of the pass-through hole, and a frame disposed to surround the base-mounting area and configured to form a light-emitting area.

The plurality of LED elements are configured to form a plurality of units in which at least two LED elements are connected in series to the electrodes provided on the opposite sides of each pass-through hole. The plurality of units are arranged parallel with each other and electrically connected in parallel to the electrodes, and each of the units is disposed between the electrodes.

An LED apparatus in another embodiment includes a base including an upper surface, a lower surface opposite the upper surface and a peripheral edge side surface provided between the upper surface and the lower surface and having thermal conductivity, an insulative substrate including an upper surface provided with electrodes, a lower surface opposite the upper surface and a plurality of elongate pass-through holes provided to pass through the upper surface and the lower surface, the lower surface of the insulative substrate being attached to the upper surface of the base, a plurality of base-mounting areas that are exposed parts of the upper surface of the base, exposed within the plurality of pass-through holes of the substrate, a plurality of LED elements mounted on each of the plurality of base-mounting areas, a frame disposed to surround the plurality of base-mounting areas and configured to form a light-emitting area, and electrodes provided on the substrate.

The plurality of elongate pass-through holes provided in the substrate are arranged parallel in a length direction of the pass-through holes with an interval between a pair of the elongate pass-through holes that are juxtaposed to each other. The electrodes are disposed independently between the adjacent pairs of pass-through holes parallel to the adjacent pass-through holes, and electrically connected to the plurality of LED elements.

The LED apparatus further comprises electrodes provided on the substrate at opposite outer sides positioned in a width direction perpendicular to the length direction of the parallel elongate pass-through holes.

At least two LED elements that are arranged in the width direction of each of the elongate pass-through holes and electrically connected in series to two electrodes that are disposed at opposite sides of the corresponding elongate pass-through hole, and the at least two light-emitting diode elements are electrically connected in series as a unit of the light-emitting diode elements in series.

A plurality of units are provided in each pass-through hole by arranging the units along in the length direction of each pass-through hole, each of the units including at least two LED elements arranged in the width direction and serially connected with respect to one another. The plurality of the units mounted on each base-mounting area exposed by the pass-through hole are disposed parallel and electrically connected in parallel to the two independent electrodes that are disposed at opposite sides each pass-through hole.

In mounting a plurality of LED elements, a plurality of units in each of which a plurality of LED elements are serially connected are connected parallel with respect to each other to the electrodes. Thereby, it is possible to provide a structure in which even if a part of LED elements is broken, other effective LED elements can be lighted while maintaining their brightness.

DETAILED DESCRIPTION OF THE PREFERRED EMBODIMENTS

Preferred embodiments of the present invention will be explained in detail hereinafter with reference to the accompanying drawings.

<First Embodiment>

FIGS. 1 to 6 illustrate an LED apparatus according to a first embodiment of the present invention.

The LED apparatus 1 in the first embodiment has a structure configured to set a light-emitting area, provide a base-mounting area inside the light-emitting area and mount a plurality of LED elements on the base-mounting area.

Figure 1:
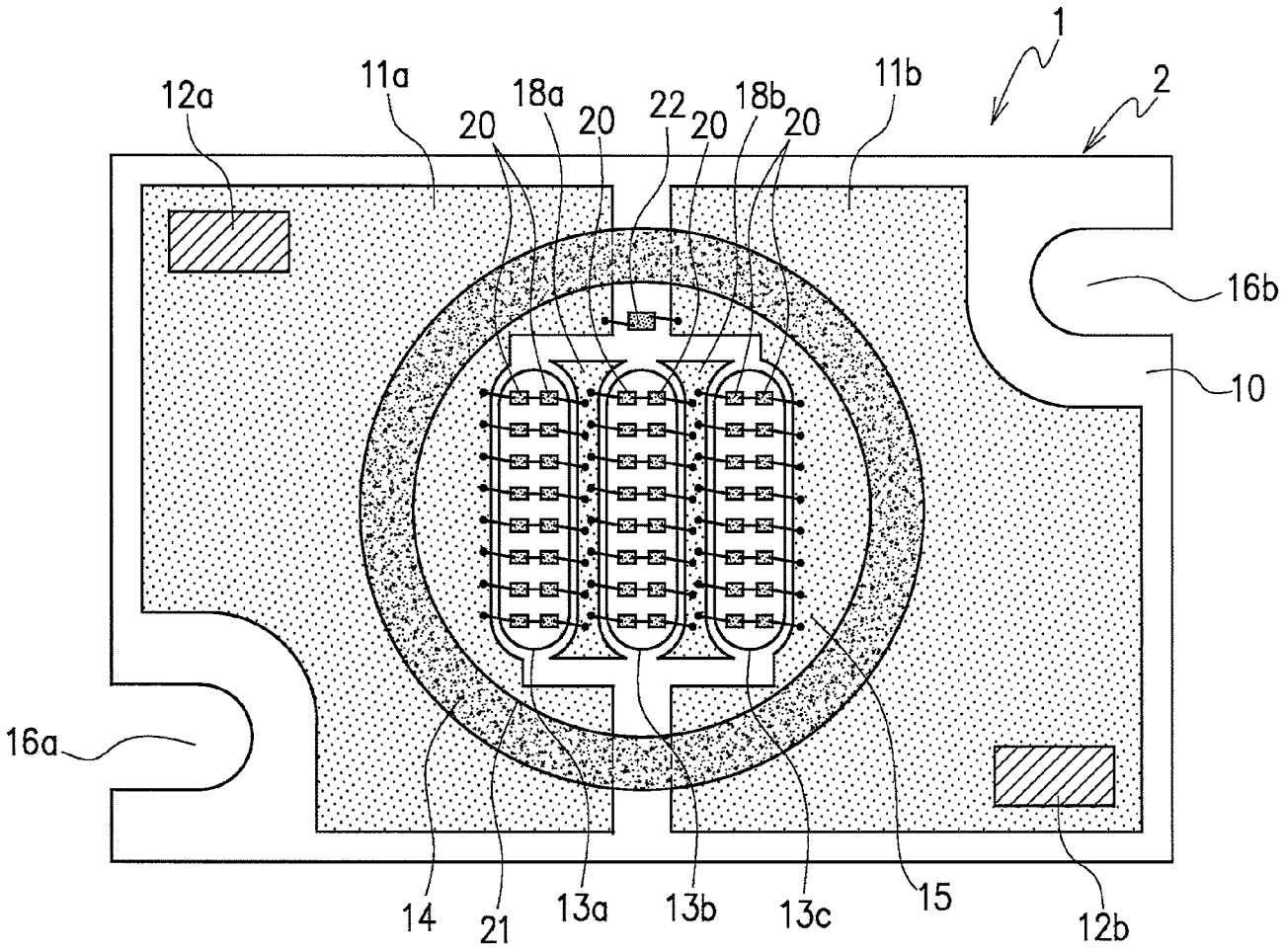
FIG. 1 is a plan view of an LED apparatus according to a first embodiment of the present invention.
Figure 2:
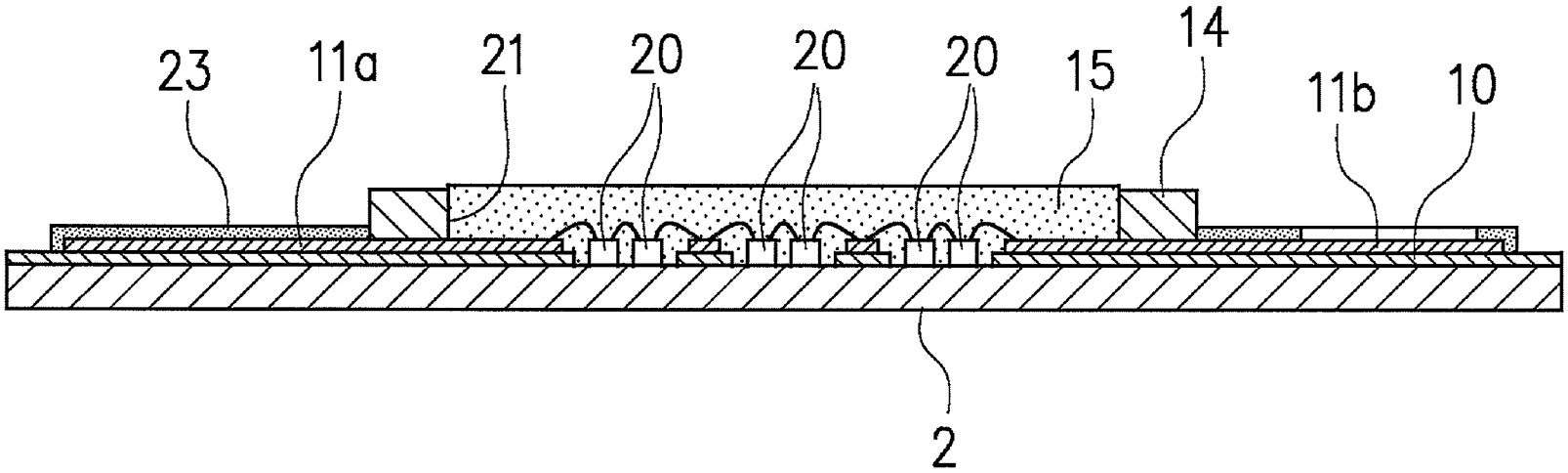
FIG. 2 is a sectional view showing the LED apparatus according to the first embodiment of the present invention.

More specifically, the LED apparatus 1 includes a base 2 having thermal conductivity and including, for example, an upper surface, a lower surface opposite the upper surface, and a peripheral edge side surface provided between the upper surface and the lower surface, a thin-plate-shape insulative substrate 10 including an upper surface provided with electrodes 11a, 11b, 18a, and 18b, a lower surface opposite the upper surface, and a plurality of pass-through holes 13a, 13b, and 13c, the lower surface of the substrate 10 being fixed to the upper surface of the base 2, and a frame 14 provided on the substrate 10 (see FIGS. 1 and 2). The base 2 is made of, for example, a metallic plate having high thermal conductivity such as an aluminum material or the like.

Figure 3:
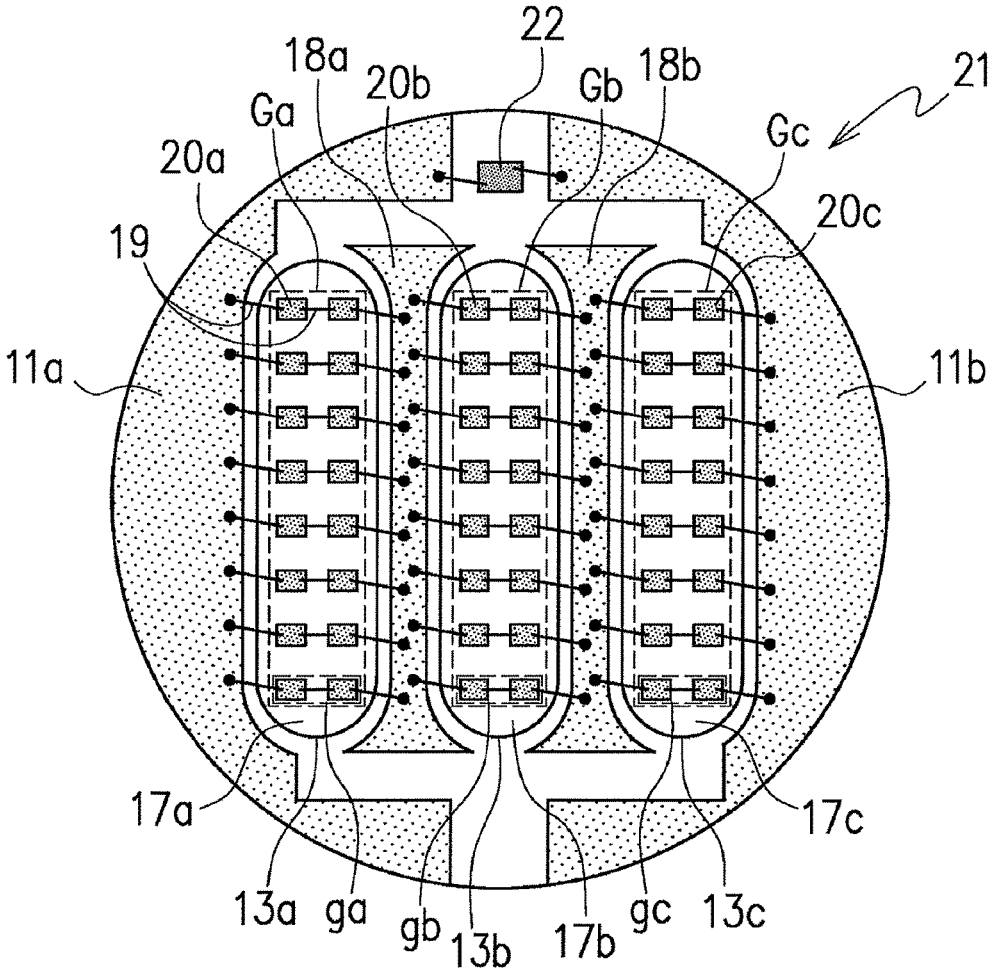
FIG. 3 is an enlarged plan view of a light-emitting area of the LED apparatus according to the first embodiment of the present invention.

The plurality of elongate pass-through holes 13a, 13b and 13c provided in the substrate 10 are extended parallel with each other, and an interval is disposed between a pair of elongate pass-through holes 13a and 13b that are juxtaposed to each other and between another pair of elongate pass-through holes 13b and 13c that are juxtaposed to each other (see FIG. 3). The electrodes 18a and 18b provided on the upper surface of the substrate 10 are formed independently between each of the juxtaposed pairs of pass-through holes 13a, 13b, and 13c. In other words, the electrodes 18a and 18b are disposed at the intervals extended in a length direction of elongate pass-through holes that are parallel with each other.

In the first embodiment, the plurality of elongate pass-through holes 13a, 13b and 13c are provided to pass through the upper surface and the lower surface of the substrate 10.

Furthermore, the electrodes 11a and 11b are disposed at opposite outer sides of the parallel elongate through holes in a width direction perpendicular to the length direction of the parallel elongate through holes.

The substrate 10 is a printed substrate made of, for example, BT (Bismaleimide Triazine) resin, glass epoxy material or the like, and the electrodes 11a, 11b, 18a and 18b are formed by a copper foil or the like provided on the upper surface of the substrate 10 (see FIGS. 1 and 2). In the first embodiment, the electrodes 11a and 11b have respectively connecting portions 12a and 12b which are exposed from a resist 23 (see FIG. 2) covering the electrodes 11a and 11b at positions adjacent to opposite corners and connected to an exterior supply (not shown) to receive a drive voltage (see FIG. 1). However, if the resist 23 is not provided, it is possible to supply a drive voltage from any positions of the electrodes, without being limited to the opposite corners.

At least two LED elements arranged in the width direction of the pass-through holes are mounted on a base-mounting area exposed by each of the pass-through holes and connected in series to the two independent electrodes arranged adjacent in the width direction of the pass-through holes. In addition, a plurality of the units in which the two LED elements are serially connected in the width direction of the pass-through holes are arranged in the length direction of each pass-through hole to form a plurality of the units. The plurality of the units mounted on the base-mounting area exposed from each of the pass-through holes are mutually connected parallel to the two independent electrodes which are arranged adjacent in the wide direction of the pass-through holes.

The frame 14 has, for example, a ring-like shape of a thin thickness, is made of a material in which silicone is mixed with oxide titan, and fixed at approximately a central portion of the substrate 10 to surfaces of the electrodes 11a and 11b in a state bridging them by a suitable device (see FIG. 1). The frame 14 is configured to form, for example, a circular light-emitting area 21 in an inner side thereof. The frame 14 and the light-emitting area 21 may be formed in any shapes without being limited to the circular shape. Meanwhile, the light-emitting area 21 and a detailed inner structure thereof are mentioned hereinafter.

At least one base-mounting area as mentioned above is provided on the substrate 10 inside the light-emitting area 21 (see FIG. 1). In one embodiment, the base-mounting area is formed by at least one pass-through hole provided to pass through the substrate 10 so that a part of the upper surface of the base 2 is exposed.

A plurality of LED elements 20 are disposed in the base-mounting area. The LED elements 20 are mounted on the base 2 and electrically connected to each other through, for example, a wire 19 which is a metallic thin line.

In place of the one base-mounting area, in the illustrated embodiment, a plurality of, for example, three base-mounting areas 17a, 17b and 17c are provided (see FIG. 3). Each of the base-mounting areas 17a, 17b and 17c has a generally rectangular shape, and they are formed by three pass-through holes 13a, 13b and 13c which are arranged at intervals. A plurality of LED elements 20 are directly mounted on the upper surface of the base 2 exposed by the pass-through holes 13a, 13b and 13c (see FIGS. 1 and 2). Meanwhile, the plurality of base-mounting areas 17a, 17b and 17c are mentioned hereinafter.

Here, because the plurality of LED elements 20 are emitted in a circular area inside the frame 14, the circular area is referred to as the light-emitting area 21 as mentioned above.

A sealing member 15 to seal the plurality of LED elements 20 and so on is provided in an inner side of the frame 14, in other words, the light-emitting area 21 (see FIGS. 1 and 2). The sealing member 15 is formed, for example, by filling the light-emitting area with a resin and hardening the same. The sealing member 15 has light-transmitting property to emit light emitted from the LED elements 20 therethrough to outside. Meanwhile, the sealing member 15 is shown to be transparent in FIGS. 1 and 3 to be easy to understand the inside of the light-emitting area 21. An inner diameter of the frame 14 is about 11 mm as an example, and hence, a diameter of the light-emitting area 21 is about 11 mm. The size of the frame 14 is not limited to this example, and may be set to any size.

Mounting parts 16a and 16b configured to mount the LED apparatus 1 on a radiator or the like (mentioned hereinafter) which is mentioned hereinafter by, for example, screws (not shown) are provided on opposing corners of the base 2 and the substrate 10 (see FIG. 1). Here, the electrodes 11a and 11b are formed around the mounting parts 16a and 16b. For example, a white resist 23 and electrode terminals 12a, 12b are provided on the electrodes 11a and 11b disposed on the upper surface of the substrate 10 at an outer side of the light-emitting area 21 (see FIG. 2). The white resist 23 is not shown in FIG. 1 with omitted.

Next, further details of the light-emitting area 21 of the LED apparatus according to the first embodiment are explained with reference to FIG. 3.

As shown in FIG. 3, the light-emitting area 21 has the circular shape as mentioned above. The light-emitting area 21 is surrounded by the frame 14 as shown in FIG. 1. The three pass-through holes 13a, 13b and 13c, each having the generally rectangular shape, which pass through the electrodes 11a, 11b and the substrate 10 are formed in the substrate 10 at equal intervals inside the light-emitting area 21. The upper surface of the base 2 is exposed by the three pass-through holes, and thereby three base-mounting areas 17a, 17b and 17c are formed. In other words, the base-mounting areas 17a, 17b and 17c are areas arranged inside the light-emitting area 21, and in each of which the upper surface of the base 2 is exposed. Each of the base-mounting areas 17a, 17b and 17c has approximately the rectangular shape and includes opposite short sides each having an approximately semi-circular shape. However, each of the base-mounting areas 17a, 17b and 17c is not limited to this shape, and may be formed in various shapes such as having straight short sides.

In addition, a part of the electrode 11a is formed at a left side inside the light-emitting area 21 in FIG. 3, and thereby a portion adjacent to a left side of the pass-through hole 13a is defined, and a part of the electrode 11b is formed at a right side inside the light-emitting area 21, and thereby a portion adjacent to a left side of the pass-through hole 13c is defined. The independent electrode 18a is formed between the pass-through holes 13a and 13b, and the independent electrode 18b is formed between the pass-through holes 13b and 13c.

The plurality of LED elements 20 are mounted on the exposed upper surface of the base 2 in each of the base-mounting areas 17a, 17b and 17c (see FIG. 3). In this case, in the base-mounting area 17a, first LED elements 20a in which eight (8) sets of LED elements are longitudinally arranged, each set having laterally arranged two LED elements are mounted on and fixed to the base 2 by a conductive adhesive or the like. Similarly, in the base-mounting area 17b, second LED elements 20b in which eight (8) sets of LED elements are longitudinally arranged, each set having laterally arranged two LED elements are mounted on and fixed to the base 2 by a conductive adhesive or the like. Similarly, in the base-mounting area 17c, third LED elements 20c in which eight (8) sets of LED elements are longitudinally arranged, each set having laterally arranged two LED elements are mounted on and fixed to the base 2 by a conductive adhesive or the like.

Consequently, the first to third LED elements 20a, 20b and 20c, each having 16 LED elements are disposed in the base-mounting areas 17a, 17b and 17c, respectively, and the LED apparatus has totally 48 LED elements.

Meanwhile, to facilitate understanding, reference numbers 20a, 20b and 20c are respectively attached to the first to third LED elements mounted in each of the base-mounting areas 17a, 17b and 17c, and reference number 20 is attached to all the LED elements to be mounted. In the first embodiment, the number of the LED elements 20 is not limited to the aforementioned example, and may adequately be set in accordance with specifications of the LED apparatus.

Next, a connection of the LED elements is explained.

The LED elements 20a, 20b and 20c mounted in the base-mounting areas 17a, 17b and 17c, respectively are all arranged in the same direction. As an example, the LED elements are arranged so that anode terminals (not shown) are disposed in a left side as viewed from FIG. 3 and cathode terminals (not shown) are disposed in a right side as viewed from FIG. 3. All the LED elements 20 are electrically connected through a wire 19 which is, for example, a metallic thin line by a wire bonder (not shown).

Here, each of the eight LED elements 20a mounted on the left side of the base-mounting area 17a in FIG. 3 has an anode terminal electrically connected through the wire 19 to the electrode 11a. Each of the left eight LED elements 20a in which the anode terminal is connected to the electrode has a cathode terminal (not shown) electrically connected through the wire 19 to an anode terminal of each of the eight LED elements 20a mounted on the right side of the base-mounting area 17a in FIG. 3. In addition, the cathode terminal of each of the right eight LED elements 20a in which the anode terminal is connected to the cathode terminal of each of the left eight LED elements is electrically connected through the wire 19 to the independent electrode 18a.

Each of the eight LED elements 20b mounted on the left side of the base-mounting area 17b in FIG. 3 has an anode terminal electrically connected through the wire 19 to the electrode 18b. Each of the left eight LED elements 20a in which the anode terminal is connected to the electrode 18b has a cathode terminal (not shown) electrically connected through the wire 19 to an anode terminal of each of the eight LED elements 20a mounted on the right side of the base-mounting area 17b in FIG. 3. In addition, the cathode terminal of each of the right eight LED elements 20a in which the anode terminal is connected to the cathode terminal of each of the left eight LED elements is electrically connected through the wire 19 to the independent electrode 18b.

Each of the eight LED elements 20c mounted on the left side of the base-mounting area 17c in FIG. 3 has an anode terminal electrically connected through the wire 19 to the electrode 18b. Each of the left eight LED elements 20c in which the anode terminal is connected to the electrode has a cathode terminal (not shown) electrically connected through the wire 19 to an anode terminal of each of the eight LED elements 20c mounted on the right side of the base-mounting area 17c in FIG. 3. In addition, the cathode terminal of each of the right eight LED elements 20c in which the anode terminal is connected to the cathode terminal of each of the left eight LED elements is electrically connected through the wire 19 to the right electrode 11b.

In this way, in the base-mounting area 17a, the laterally arranged two LED elements 20a are connected in series through the wire 19. Thereby, a small group ga (a portion surrounded by a dashed line) of LED elements is formed (see FIG. 3). Eight small groups ga of LED elements are connected in parallel between the electrode 11a and the electrode 18a, thereby a large group Ga (a portion surrounded by a dashed line) of LED elements is formed (see FIG. 3). Here, although the base-mounting area 17a is a narrow area, sixteen LED elements can be mounted in the narrow area and connected to each other. This is because a high mounting density can be acquired by arranging the LED elements 20a in two lines and directly wiring the adjacent LED elements 20a through the wire 19.

Similarly, in the base-mounting area 17b, the laterally arranged two LED elements 20b are connected in series through the wire 19. Thereby, a small group gb (a portion surrounded by a dashed line) of LED elements is formed (see FIG. 3). Eight small groups gb of LED elements are connected in parallel between the electrode 18a and the electrode 18b, thereby a large group Gb (a portion surrounded by a dashed line) of LED elements is formed (see FIG. 3).

Similarly, in the base-mounting area 17c, the two laterally arranged LED elements 20c are connected in series through the wire 19. Thereby, a small group gc (a portion surrounded by a dashed line) of LED elements is formed (see FIG. 3). Eight small groups gc of LED elements are connected in parallel between the electrode 18b and the electrode 11b, thereby a large group Gc (a portion surrounded by a dashed line) of LED elements is formed (see FIG. 3).

By the aforementioned connection, the three large groups Ga, Gb and Gc are connected through the electrodes 18a and 18b in series. That is to say, the LED elements 20 in the first embodiment has a structure in which the LED elements 20 constituting each of the small groups ga, gb and gc are connected in series by a wiring between the LED elements, small groups in each base-mounting area are connected in parallel with respect to each other to form the large group, and the large groups Ga, Gb and Gc in each base-mounting area are connected in series through the electrodes 18a and 18b.

Meanwhile, in FIG. 3, reference number 22 shows an ESD (Electric Static Discharge) element to protect the LED elements 20 from static electricity or the like. The ESD 22 is structured by a tuner diode and connected between the electrodes 11a and 11b.

In this way, because the LED apparatus according to the first embodiment has a structure in which a large number of LED elements as much as can be mounted on the narrow circular light-emitting area 21 having the diameter of about 11 mm, it is possible to acquire a high light intensity although the light-emitting area has a narrow space, and thereby an LED apparatus having a high lumen-density can be provided. A reason that a large number of LED elements 20 can be mounted on the narrow light-emitting area 21 is for wiring directly the adjacent LED elements 20 by the wire 19 and connecting in series them, as mentioned above.

Next, a connection circuit for the LED elements in the LED apparatus according to the first embodiment is explained with reference to FIG. 4.

Figure 4:
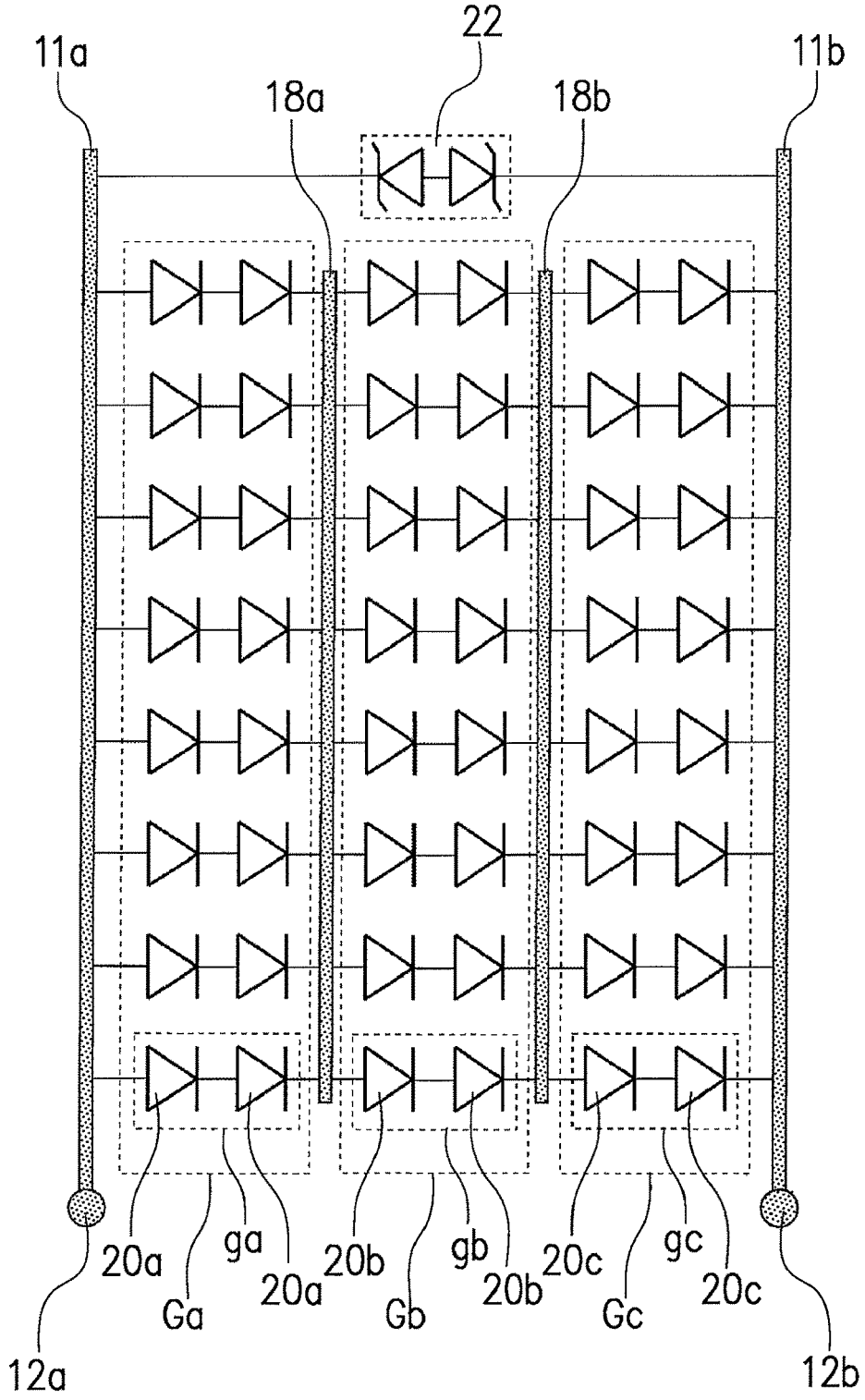
FIG. 4 is a view for explaining a circuit showing a state where LED elements in the LED apparatus according to the first embodiment of the present invention are connected.

As shown in FIG. 4, in the LED apparatus 1 according to the first embodiment, a total of forty-eight (48) LED elements are connected. The large group Ga in which the eight small groups ga, each including the laterally arranged two LED elements 20a connected in series are arranged longitudinally and connected in parallel is connected between the electrode 11a and the electrode 18a.

Moreover, the large group Gb in which the eight small groups gb, each including the laterally arranged two LED elements 20b connected in series are arranged longitudinally and connected in parallel is connected between the electrode 18a and the electrode 18b.

Furthermore, the large group Gc in which the eight small groups gc, each including the laterally arranged two LED elements 20a connected in series are arranged longitudinally and connected in parallel is connected between the electrode 18b and the electrode 11b.

The connection makes it possible to form the three large groups Ga, Gb and Gc connected in series through the electrodes 18a and 18b between the electrodes 11a and 11b, that is to say, the electrode terminals 12a and 12b. Consequently, when a predetermined drive voltage is applied to the electrode terminals 12a and 12b, a generally ⅓ drive voltage is dividedly applied to each of the large groups Ga, Gb and Gc to flow the drive voltage to all the small groups ga, gb and gc, thereby it is possible to light all the LED elements 20. In this case, because each of the large groups Ga, Gb and Gc is structured by each of the eight small groups ga, gb and gc in each of which the two LED elements are serially connected, it is possible to reduce a variation in characteristic of each LED element.

Because the large groups Ga, Gb and Gc are serially connected, an equal drive voltage flows in each large group, and therefore the LED elements 20a, 20b and 20c in the large groups Ga, Gb and Gc have approximately an equal light-emitting amount. Thereby, it is possible to accomplish an LED apparatus capable of reducing variation in light-emitting or luminescent amount of each LED element even though a large number of LED elements are provided.

In this way, the LED apparatus according to the aforementioned embodiment adopts a basic structure in which although a large number of LED elements are mounted and driven, adjacent LED elements are connected in series through wires, and groups serially connected are connected parallel. In addition, in the first embodiment, the groups parallel connected are further serially connected.

Here, if all of a large number of LED elements are serially connected, because the same drive current flows in all the LED elements, it is possible to inhibit light-emitting variation of each LED element by a conformed drive condition. However, when a large number of LED elements are serially connected, because a high drive voltage must be used, a special drive circuit is required, and hence there is a problem in economic efficiency and safety. On the other hand, if all the LED elements are connected parallel, a low drive voltage may be used, but a significant difference results in a drive voltage flowing in each LED element due to electric characteristic variation in the LED elements and hence there is a problem that a large light-emitting variation occurs.

In this way, there is a problem in both of a series connection and a parallel connection of the LED elements. In the first embodiment, a large number of LED elements are divided into a predetermined number of groups, and a series connection and a parallel connection are combined, thereby there is an excellent advantageous effect that a drive voltage can be prevented from becoming a high voltage, and variation in light-emitting amount of each LED element can be inhibited. Meanwhile, the excellent advantageous effect can be achieved even in other embodiments which are mentioned hereinafter. In FIG. 4, the aforementioned ESD element 22 is connected between the electrodes 11a and 11b.

Next, one example of an operation of the LED apparatus according to the first embodiment is described with reference to FIG. 5.

Figure 5:
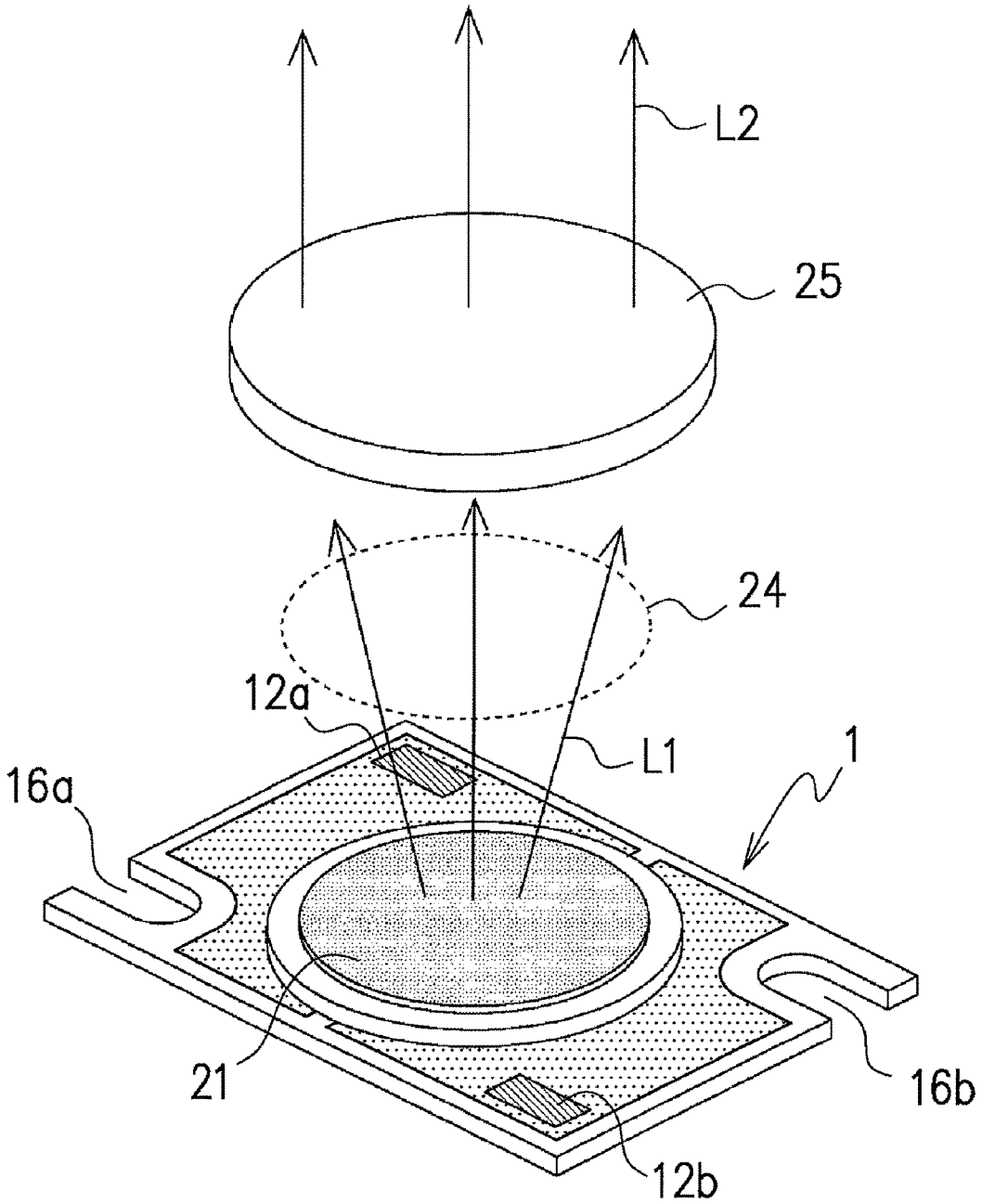
FIG. 5 is a perspective view for explaining an operation of the LED apparatus according to the first embodiment of the present invention.

As shown in FIG. 5, a drive power source (not shown) is connected to the two electrode terminals 12a and 12b of the LED apparatus 1, and when a predetermined drive voltage is applied to the electrode terminals, a drive current flows in all the LED elements (see FIG. 1) mounted inside the light-emitting area 21 as mentioned above, thereby the LED apparatus 1 is lighted so as to emit powerful outgoing light L1.

Because the light-emitting area 21 has the circular shape, the outgoing light L1 is emitted from the light-emitting area while diffusing as a generally circular light-emitting pattern 24 (shown in a dashed line), but collected a lens 25 disposed above the light-emitting area 21 with a predetermined distance. Light L2 thus collected is emitted from the lens 25.

In this way, because the LED apparatus 1 can emit the outgoing light L1 of a good light-emitting pattern easy to collect, from the narrow circular light-emitting area 21, it is possible to easily structure an optical system such as the lens 25 and so on to collect the outgoing light L1, and provide a compact LED apparatus having high lumen-density, excellent high brightness and high output, and excellent light-gathering power.

Next, a structure in which the radiator is mounted on the LED apparatus according to the first embodiment is described with reference to FIG. 6.

Figure 6:
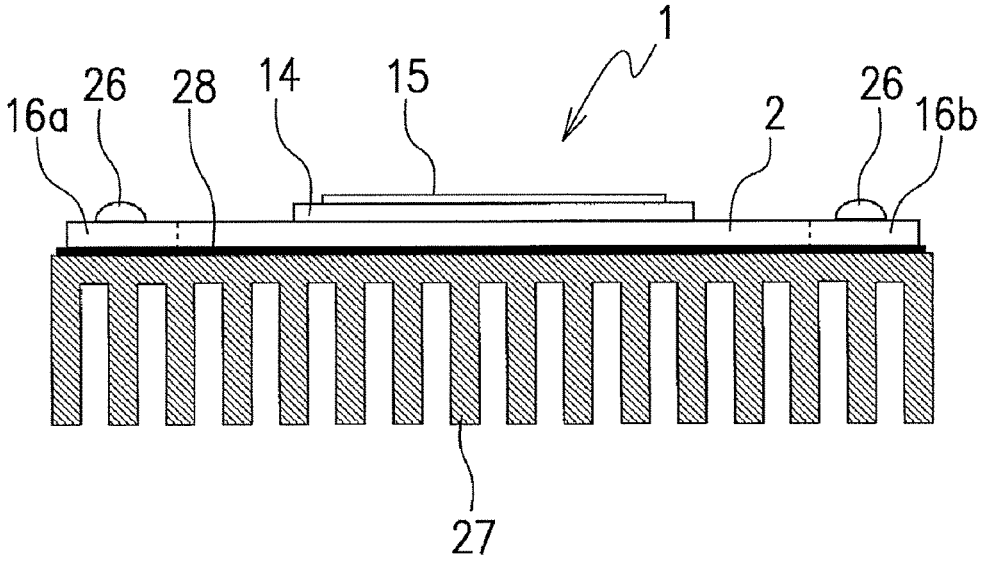
FIG. 6 is a side view showing a state where a radiator is mounted on the LED apparatus according to the first embodiment of the present invention.

As shown in FIG. 6, the radiator, for example, a heatsink 27 is mounted on the lower surface of the base 2 of the LED apparatus 1. The heatsink 27 is fixed to a bottom surface of the base 2 by inserting mounting screws 26 into two mounting portions 16a and 16b provided in the base 2, and screwing the mounting screws 26 into threaded holes (not shown) provided in the heatsink 27. In this case, if a thermally-conductive silicone 28 is applied between the base 2 and the heatsink 27, it is possible to further enhance heat-release effect.

With the structure, in the LED apparatus 1, because a large number of LED elements are mounted, and the LED elements 20 are directly mounted on the upper surface of the base 2, heat occurred in the LED elements is effectively transmitted to the thermally-conductive base 2, and then to the heatsink 27 with a low thermal resistance.

Consequently, it is possible to release efficiently heat occurred in the LED elements 20, inhibit increment of temperature of the LED elements 20, and provide an LED apparatus having long service life, excellent reliability, high output and high brightness. Meanwhile, although the heatsink 27 has the same size as the LED apparatus 1 in the first embodiment, an outer shape of the heatsink is not limited. For example, a heatsink having an outer shape larger than that of the LED apparatus 1 may be mounted on the LED apparatus 1 to further increase efficiency of heat release.

<Second Embodiment>

Next, a schematic structure of an LED apparatus according to a second embodiment of the present invention is described with reference to FIG. 7. In this embodiment, in the plurality of light-emitting diode elements, at least two light-emitting diode elements that are extended in a line between the electrodes that are provided along opposite sides of the pass-through hole, and electrically connected in series as a unit of light-emitting diode elements in series. A plurality of the units of light-emitting diode elements in series are arranged parallel with each other in a direction perpendicular to the line of the at least two light-emitting diode elements as the unit, and the units are disposed parallel and electrically connected to the electrodes in parallel.

The LED apparatus 30 in the second embodiment has a structure in which a large number of LED elements are mounted in a base-mounting area having approximately a square shape which has good mounting efficiency. Because a basic structure of the LED apparatus 30 in the second embodiment as shown in FIG. 7 is similar to that of the aforementioned LED apparatus in the first embodiment, identical reference numbers are attached to the similar parts to that in the first embodiment, a duplicative description is omitted.

Figure 7:
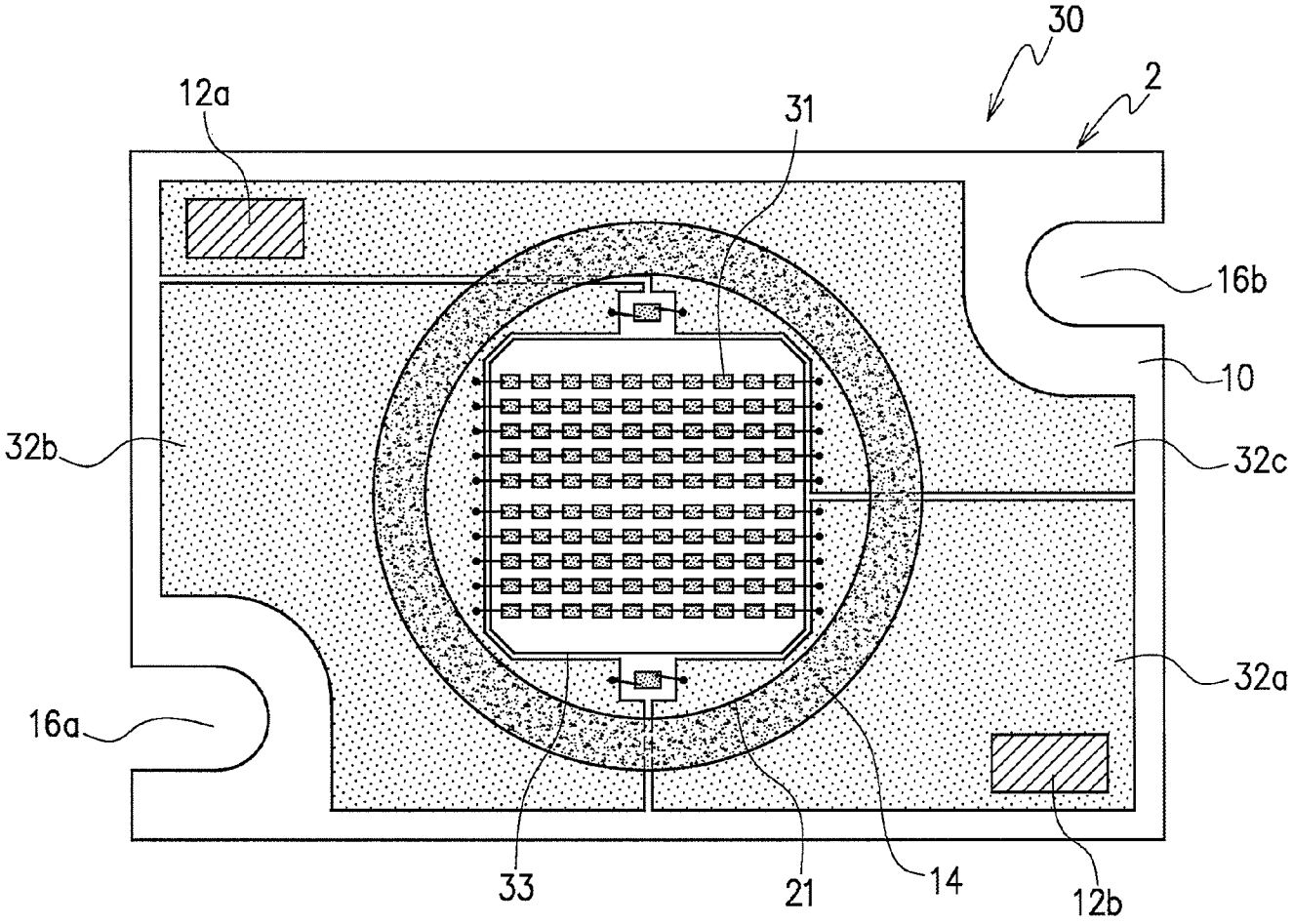
FIG. 7 is a plan view of an LED apparatus according to a second embodiment of the present invention.

As shown in FIG. 7, the LED apparatus 30 in the second embodiment includes a base 2 made of a material having thermal conductivity such as aluminum or the like, an insulative substrate 10 made of a thin glass epoxy material and fixed to one surface of the base 2, a plurality of LED elements 31 mounted in a base-mounting area formed on a surface of the substrate, and a frame 14 disposed on the substrate 10 to surround the base-mounting area. The substrate 10 includes three electrodes 32a, 32b and 32c, each of which is formed by a copper foil covering a large part of the surface of the substrate 10. The electrodes 32c and 32a have respectively electrode terminals 12a and 12b which are provided at opposite corner portions of the substrate 10 and connected to an outer device (not shown) to receive a drive voltage.

In the second embodiment, the frame 14 has a ring-like shape of a thin thickness, is made of a material similar to that in the first embodiment, and fixed at approximately a central portion of the substrate 10.

The base-mounting area is formed by approximately a square pass-through hole 33 provided in the substrate 10 inside the frame 14. The plurality of LED elements 31 are directly mounted on a surface of the base 2 exposed by the pass-through hole 33. Because the plurality of LED elements 20 are emitted in a circular area inside the frame 14, the circular area is referred to as a light-emitting area 21, similarly to the first embodiment.

A light-transmitting sealing member 15 to seal the plurality of LED elements 20 and so on is provided in an inner side of the frame 14, in other words, the light-emitting area 21 (see FIG. 2). The sealing member 15 is formed, for example, by filling the light-emitting area with a resin and hardening the same. The sealing member 15 is shown to be transparent to be easy to understand the inside of the light-emitting area 21.

A white resist is provided on each of the three electrodes 32a, 32b and 32c provided in an outer area of the frame 14. The white resist is not shown in FIG. 7.

An inner diameter of the frame 14 is about 11 mm, similarly to that in the first embodiment, and therefore a diameter of the light-emitting area 21 is about 11 mm. Because mounting parts 16a and 16b and so on are similar to that in the first embodiment, a description thereof is omitted.

Next, details of the light-emitting area in the second embodiment are described with reference to FIG. 8.

Figure 8:
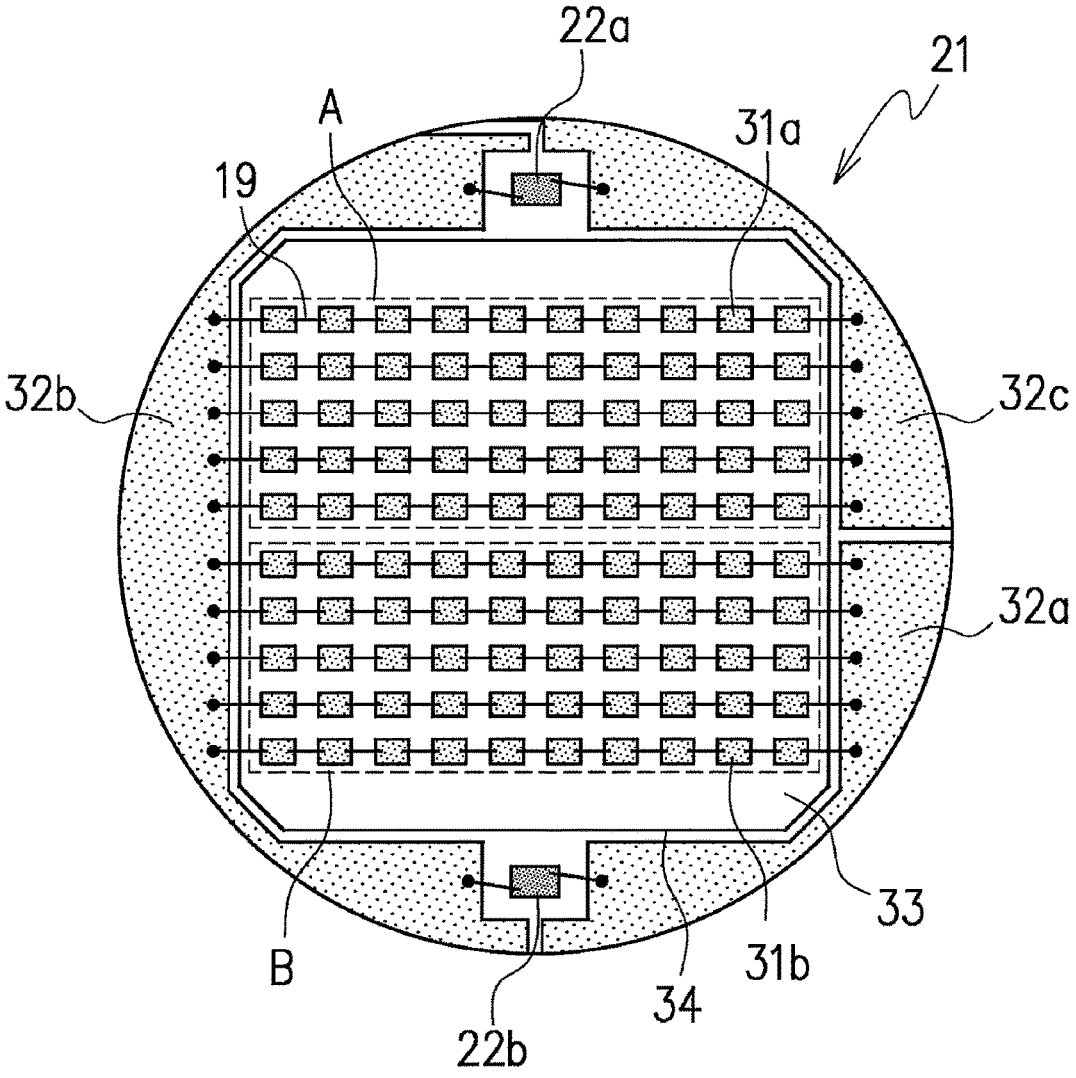
FIG. 8 is an enlarged plan view of a light-emitting area of the LED apparatus according to the second embodiment of the present invention.

In FIG. 8, the LED apparatus in the second embodiment includes a base including an upper surface, a lower surface opposite the upper surface and a peripheral edge side surface provided between the upper surface and the lower surface and having thermal conductivity, an insulative substrate including an upper surface provided with electrodes, a lower surface opposite the upper surface and a path-through hole 33 provided to pass through the upper surface and the lower surface, the lower surface of the insulative substrate being attached to the upper surface of the base, at least one base-mounting area 34 that is an exposed part of the upper surface of the base, exposed within the pass-through hole 33 of the substrate, a plurality of LED elements 31a, 31b mounted on the base-mounting area 34 and electrically connected to electrodes which are provided along opposite sides of the pass-through hole 33, and a frame configured to form a light-emitting area disposed to surround the base-mounting area 34.

Of the LED elements, at least two LED elements 31a, 31b that are arranged in a width direction of the elongate pass-through hole and electrically connected in series to the opposite two electrodes of the electrodes 32a, 32b, and 32c disposed along the opposite sides of the pass-through hole are defined as a unit of LED elements in series. In this embodiment, a plurality of units of LED elements that are electrically connected in series are provided, and the units are disposed parallel with each other in a length direction of the pass-through hole and electrically connected to the opposite electrodes in parallel.

As shown in FIG. 8, the light-emitting area is, for example, a circular shape, and surrounded by the frame 14 (see FIG. 7). As mentioned above, the approximately square pass-through hole 33 is formed in the substrate 10 inside the light-emitting area 21. By the pass-through hole 33, a surface of the base 2 is exposed, thereby the approximately square base-mounting area 34 is formed. That is to say, the base-mounting area 34 is an area where the surface of the base 2 is exposed and which is disposed inside the light-emitting area 21. The base-mounting area 34 has a square shape including chamfered four corners in the first embodiment. However, the base-mounting area 34 is not limited to this shape, for example, may be a polygonal shape, and the four corners may not be chamfered.

A part of the electrode 32b is formed on a left side of the light-emitting area 21 as viewed from FIG. 8 and covers a vicinity of the left side of the pass-through hole 33. A part of the electrode 32a is formed on a lower right side of the light-emitting area 21 as viewed from FIG. 8 and covers a vicinity of the lower right side of the pass-through hole 33. A part of the electrode 32c is formed on an upper right side of the light-emitting area 21 as viewed from FIG. 8 and covers a vicinity of the upper right side of the pass-through hole 33.

The plurality of LED elements 31 are mounted on the base-mounting area 34 in which the surface of the base 2 is exposed, as shown in FIG. 8. In this case, in FIG. 8, the base-mounting area 34 is divided into an upper portion and a lower portion. The upper portion is defined as a block A (portion surrounded by a dashed line) and the lower portion is defined as a block B (portion surrounded by a dashed line). LED elements mounted in the block A are referred to as first LED elements and LED elements mounted in the block B are referred to as second LED elements.

The first LED elements 31a mounted in the A block are arranged in a manner of the unit in which ten LED elements are connected in series and the parallel connection unit in which five units are connected in parallel. The second LED elements 31b mounted in the block B are similarly arranged in a manner of the unit in which ten LED elements are connected in series to the electrodes and the parallel connection unit in which five units are connected in parallel to the electrodes. Consequently, one hundred (100) LED elements are totally mounted.

Meanwhile, the number of the LED elements is not limited, and can be optionally decided according to specifications of the LED apparatus 30. Here, because the base-mounting area 34 has an approximately square shape contacting with the circular light-emitting area 21, as mentioned above, a base-mounting area having a more wide area in which as many LED elements as possible are disposed can be acquired. In addition, because the same number of LED elements 31 can be arranged in a longitudinal array and a lateral array in the base-mounting area, high mounting efficiency can be acquired.

Next, a connection of the LED elements is described.

The first LED elements 31a of the block A mounted in the base-mounting area 34 are, as an example, mounted so that anode terminals (not shown) are disposed in a left side as viewed from FIG. 8 and cathode terminals (not shown) are disposed in a right side as viewed from FIG. 8. The second LED elements 31b of the block B mounted in the base-mounting area 34 are, as an example, mounted so that anode terminals (not shown) are disposed in a right side as viewed from FIG. 8 and cathode terminals (not shown) are disposed in a left side as viewed from FIG. 8. All the LED elements 31a and 31b are electrically connected through a wire 19 which is, for example, a metallic thin line by a wire bonder (not shown).

Here, the anode terminal of each of the five LED elements 31a of the A block mounted on the leftmost of the base-mounting area 34 in FIG. 8 is electrically connected through the wire 19 to the electrode 32b. The cathode terminal of each of the left five LED elements 31a in which the anode terminals are connected to the electrode 32b is electrically connected through the wire 19 to the anode terminal of the right adjacent LED element 31a in FIG. 8. The cathode terminal of the right adjacent LED elements 31a is connected to the anode terminal of the further right adjacent LED element through the wire 19. In the similar manner, the LED elements are sequentially connected. The cathode terminal of each of the longitudinally arranged five LED elements of the block A at the rightmost in FIG. 8 is electrically connected through the wire 19 to the electrode 32c. Consequently, in the block A, the five (5) units in each of which the laterally arranged ten LED elements 31a are connected in series are connected parallel between the electrodes 32b and 32c by wiring of the wire 19.

On the other hand, the cathode terminal of each of the five (5) longitudinally arranged LED elements 31b of the block B mounted on the leftmost of the base-mounting area 34 in FIG. 8 is electrically connected through the wire 19 to the electrode 32b. The anode terminal of each of the left five longitudinally arranged LED elements 31b in which the cathode terminals are connected to the electrode 32a is electrically connected through the wire 19 to the cathode terminal of the right adjacent LED element 31a in FIG. 8. The anode terminal of the right adjacent LED element 31a is connected to the cathode terminal of the further right adjacent LED element through the wire 19. In the similar manner, the LED elements are sequentially connected. The cathode terminal of each of the longitudinally arranged five LED elements of the block B at the rightmost in FIG. 8 is electrically connected through the wire 19 to the electrode 32a. Consequently, in the block B, the five (5) units in each of which the laterally arranged ten (10) LED elements 31b are connected in series are connected parallel between the electrodes 32b and 32a by wiring of the wire 19.

The connection makes it possible to connect a group of the LED elements 31a of the block A and a group of the LED elements 31b of the block B in series through the electrodes 32b and 32c, 32a. That is to say, in the connection of the LED elements 31 in the second embodiment, the ten LED elements 31 are serially connected by wiring among the LED elements to form a group, and groups, and the groups are connected parallel, thereby the blocks A and B are structured, and further the blocks A and the B are serially connected.

Reference numbers 22a and 22b show ESDs (Electric Static Discharge) elements to protect the LED elements 31 from static electricity or the like, similarly to the first embodiment. Each of the ESDs 22a and 22b is structured by a tuner diode, they are connected between the electrodes 32b and 32c, and electrodes 32b and 32a, respectively.

In this way, because the LED apparatus 30 according to the second embodiment has the approximately square base-mounting area 34 having high mounting efficiency and a structure in which the ten LED elements are connected in series by wiring, it is possible to acquire mounting density of the LED higher than that in the first embodiment. Thereby, because a large number of LED elements can be mounted in the circular narrow the light-emitting area 21 having the diameter of about 11 mm, it is possible to acquire high light-emitting amount, despite the narrow area and provide an LED apparatus having high rumen-density.

Next, details of a connection circuit of the LED elements in the second embodiment are explained with reference to FIG. 9.

Figure 9:
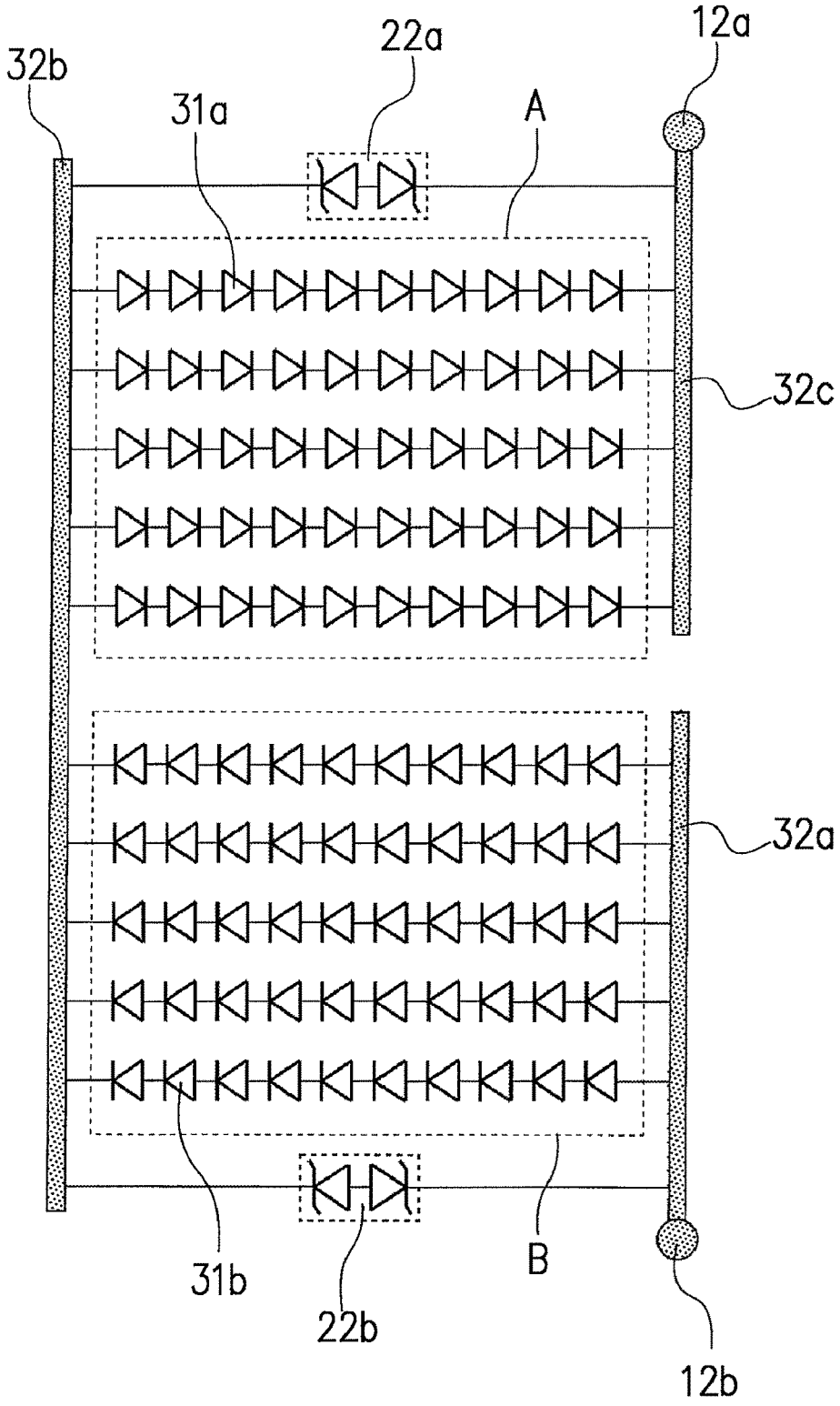
FIG. 9 is a view for explaining a circuit in which LED elements in the LED apparatus according to the second embodiment of the present invention are connected.

As shown in FIG. 9, in the LED apparatus 30 in the second embodiment, total one hundred (100) LED elements in the blocks A and B are connected. More specifically, in the A block, the five groups in each of which the ten LED elements 31a are serially connected are connected parallel between the electrodes 32b and 32c, and in the B block, the five groups in each of which the ten LED elements 31b are serially connected are connected parallel between the electrodes 32b and 32a.

The connection makes it possible to serially connect the LED element groups of the block A and the LED element groups of the block B between the electrodes 31c and 32a, that is to say, the electrode terminals 12a and 12b through the electrode 32b. Thereby, when a predetermined drive voltage is applied to the electrode terminals 12a and 12b, a generally ½ drive voltage is dividedly applied to each of the LED elements of the block A and the LED elements of the block B, and all the LED elements can be lighted. Because a large number of LED elements in the blocks A and B are serially connected, it is possible to reduce a variation in characteristic of their LED elements 31a and 31b. Also, because their groups of the blocks are connected parallel, it is possible to prevent the drive voltage from becoming a high pressure.

In addition, because the blocks A and B are serially connected, an equal drive voltage flows in the blocks A and B, and therefore each of the blocks A and B has a light-emitting amount. Consequently, it is possible to accomplish an LED apparatus capable of reducing variation in light-emitting or luminescent amount of each LED element even though a large number of LED elements are provided. The ESD elements 22a and 22b are connected between the electrodes 32a and 32c, 32b and 32a, respectively, to protect the LED elements 31a and 31b of respective blocks from static electricity. Meanwhile, an operation in the second embodiment and a mounting structure of a heat-release member are the same as in the first embodiment, and therefore a description thereof is omitted.

<Third Embodiment>

Next, an outline of an LED apparatus according to a third embodiment of the present invention is described with reference to FIG. 10.

The LED apparatus 40 in the third embodiment includes a circular base-mounting area 46 and a plurality of LED elements 41 mounted in the base-mounting area 46. For example, some of these LED elements 41 are dummy elements 42. Because a basic structure of the LED apparatus 40 in the third embodiment is the same as that of the aforementioned first and second embodiments, identical reference numbers are attached to the similar parts, the duplicative description is partially omitted.

More specifically, the LED apparatus 40 includes a base 2 made of an aluminum material or the like and an insulative substrate 10 fixed to a surface of the base 2 and formed by a thin glass epoxy plated material or the like. The substrate 10 includes three electrodes 32a, 32b and 32c formed by a copper foil covering a large part of the surface of the substrate 10. The electrodes 32c and 32a includes at opposite corner portions thereof electrode terminals 12a and 12b configured to receive a supply of a drive voltage from an outer device, respectively.

For example, a ring-like frame 14 is fixed to a surface of the substrate 10 at a position adjacent to a central portion thereof, and a circular light-emitting area 21 similar to that in the first and second embodiments is provided inside the frame 14. The base-mounting area 46 is formed by a circular pass-through hole 45 provided in the substrate 10 inside the light-emitting area 21, and the plurality of LED elements 41 and the dummy elements 42 are directly mounted on a surface of the base 2 exposed by the pass-through hole 45. A detail the LED elements 41 and the dummy elements 42 in the light-emitting area 21 is described hereinafter.

The light-emitting area 21 is filled with a light-transmitting sealing member 15 (see FIG. 2) to seal the LED elements 41 and the dummy elements 42 as mentioned above. The sealing member 15 is shown in a manner of transparence to make an inside of the light-emitting area 21 understandable. A white resist is provided on each of the three electrodes 32a, 32b and 32c shown in an area outside the frame 14. The white resist is omitted in FIG. 10.

An inner diameter of the frame 14, in other words, a diameter of the light-emitting area 21 is about 11 mm or less than it, as an example, similarly to the first and second embodiments. Because mounting parts 16a and 16b and so on to mount a radiator is similar to that in the first embodiment, a description thereof is omitted.

Next, a detail of the light-emitting area 21 in the third embodiment is described with reference to FIG. 11.

Figure 10:
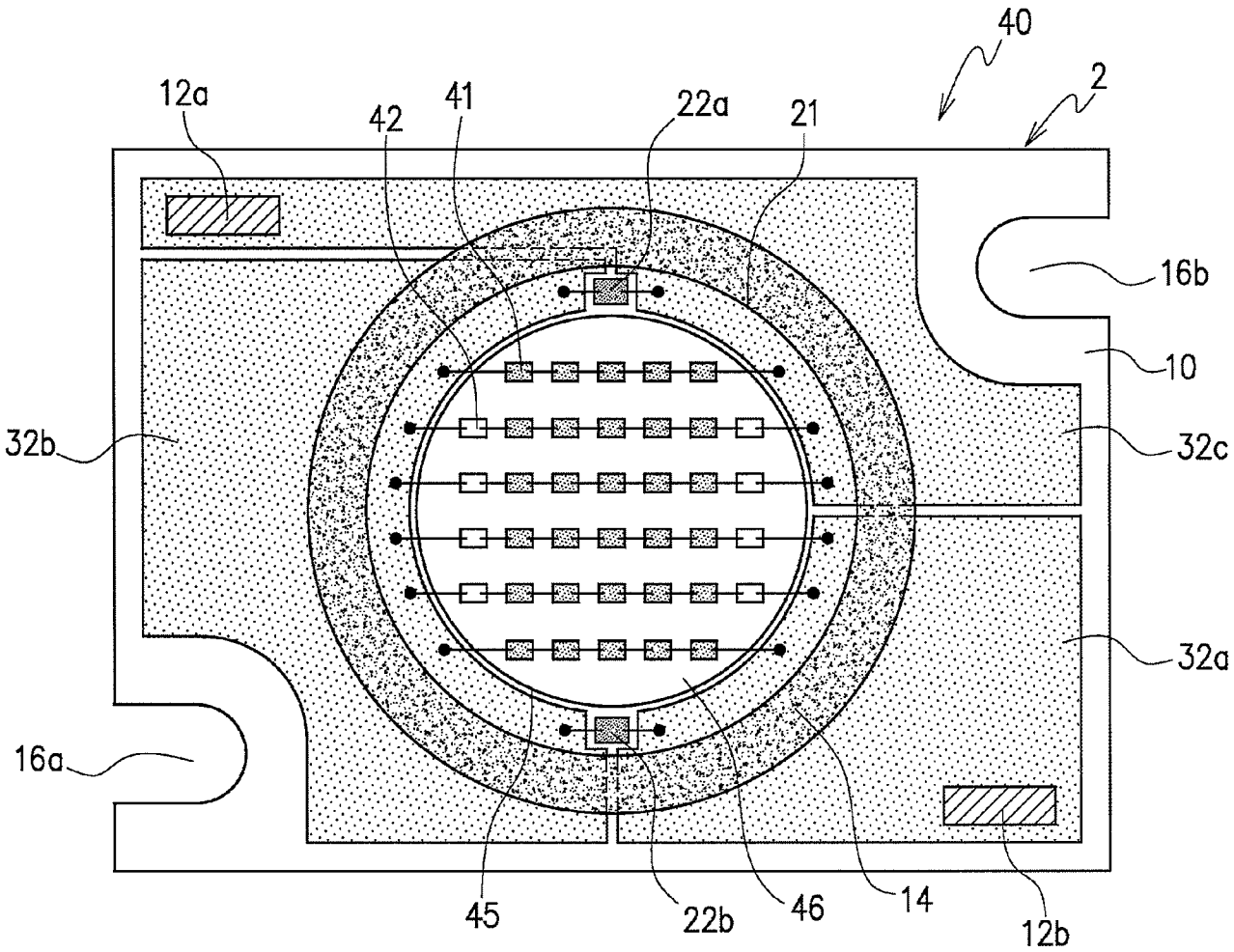
FIG. 10 is a plan view of an LED apparatus according to a third embodiment of the present invention.

As mentioned above, the light-emitting area 21 has the circular shape, and the light-emitting area 21 is surrounded by the frame 14 (see FIG. 10). As mentioned above, the substrate 10 inside the light-emitting area 21 is formed with the circular pass-through hole 45 by which the surface of the base 2 is exposed, thereby the circular base-mounting area 46 is formed. That is to say, the base-mounting area 46 is an area positioned inside the light-emitting area 21 and where the surface of the base 2 is exposed.

Figure 11:
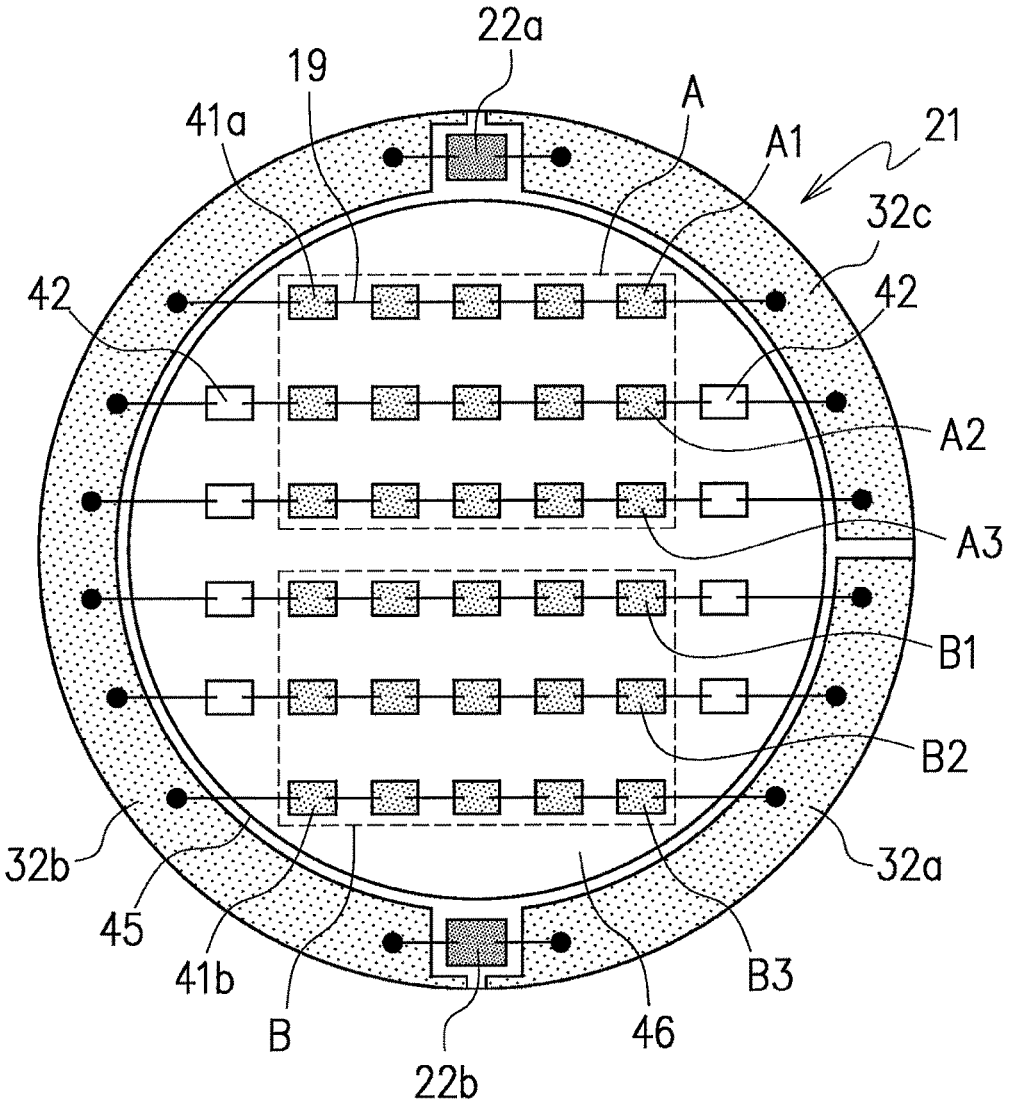
FIG. 11 is an enlarged plan view of a light-emitting area of the LED apparatus according to the third embodiment of the present invention.

A part of the electrode 32b is formed at a left side in FIG. 11 inside the light-emitting area 21 and thereby a portion adjacent to a left side of the pass-through hole 45 is defined, and a part of the electrode 32a is formed at a lower right side in FIG. 11 inside the light-emitting area 21, and thereby a portion adjacent to a lower right side of the pass-through hole 45 is defined. In addition, a part of the electrode 32c is formed at an upper right side in FIG. 11 inside the light-emitting area 21, and thereby a portion adjacent to an upper right side of the pass-through hole 45 is defined.

The plurality of LED elements 41 are mounted on the base-mounting area 46 in which the surface of the base 2 is exposed. In this case, in FIG. 11, an upper portion of approximately a central portion of the base-mounting area 46 is defined as a block A (portion surround by a dashed line), and a lower portion of the central portion of the base-mounting area 46 is defined as a block B (portion surround by a dashed line). In addition, LED elements mounted in the block A are defined as first LED elements 41a, and LED elements mounted in the block B are defined as second LED elements 41b.

The LED elements 41a mounted in the block A are mounted in three groups in each of which five LED elements are serially connected are connected parallel, and the LED elements 41b mounted in the block B are similarly mounted in three groups in each of which five LED elements are serially connected are connected parallel, totally thirty (30) LED elements are mounted. Here, in the block A, the uppermost group is defined as a group A1 in which the five laterally arranged LED elements 41a are serially connected, the intermediate group in which the five laterally arranged LED elements 41a are serially connected is defined as a group A2, the lowermost group in which the five laterally arranged LED elements 41a are serially connected is defined as a group A3.

In the block B, the uppermost group is defined as a group B1 in which the five laterally arranged LED elements 41b are serially connected, the intermediate group in which the five laterally arranged LED elements 41b are serially connected is defined as a group B2, the lowermost group in which the five laterally arranged LED elements 41b are serially connected is defined as a group B3. Meanwhile, the number of the LED elements is not limited to the aforementioned embodiment, and the number is decided based on specifications of an optical device.

One dummy element 42 is mounted at each of right and left ends of each of the groups A2 and A3 of the block A, as shown in FIG. 11, and one dummy element 42 is mounted at each of right and left ends of each of the groups B1 and B2 of the block B. Each of the dummy elements 42 is preferably is made of a transparent material having thermal conductivity, for example, sapphire, silicon-carbide, or the like, and has a size similar to the LED elements 41a and 41b. Meanwhile, the dummy elements are not mounted at right and left ends of each of the groups A1 and B3. This is because the dummy elements are not needed for a short length between electrodes connected to their groups.

Next, a, electrical connection of the LED elements 41a and the dummy elements 42 is explained.

Here, the LED elements 41a of the block A mounted in the base-mounting area 46 are arranged so that anode terminals (not shown) are disposed in a left side in FIG. 11 and cathode terminals (not shown) are disposed in a right side in FIG. 11, as an example, and the LED elements 41b of the B block mounted in the base-mounting area 46 are arranged so that anode terminals (not shown) are disposed in a right side in FIG. 11 and cathode terminals (not shown) are disposed in a left side in FIG. 11, as an example. All the LED elements 41a, 41b and the dummy elements 42 are electrically connected through wires 19 which are, for example, metallic thin lines by a wire bonder (not shown).

Here, the anode terminal of the LED element 41a mounted on the leftmost side of the group A1 of the block A, in FIG. 11 is electrically connected through the wire 19 to the electrode 32b. The cathode terminal of the LED element 41a is directly connected through the wire 19 to the anode terminal of the right adjacent LED element 41a in FIG. 11. Similarly, the cathode terminal of the right adjacent LED element is sequentially connected through the wire 19 to the anode terminal of the further right adjacent LED element. The cathode terminal of the LED element 41a mounted on the rightmost side of the group A1 in FIG. 11 is electrically connected through the wire 19 to the electrode 32c. With the connection, the five LED elements 41a of the group A1 are serially connected between the electrodes 32b and 32c by wiring between the LED elements.

The dummy element 42 is mounted on the left end of the group A2 in FIG. 11, mentioned above. The dummy element 42 is electrically connected through the wire 19 to the electrode 32b, and electrically connected through the wire 19 to the anode terminal of the LED elements 41a mounted on the leftmost side of the group A2 in FIG. 11. The cathode terminal of the LED element 41a is directly connected through the wire 19 to the anode terminal of the right adjacent LED element 41a in FIG. 11. Similarly, the cathode terminal of the right adjacent LED element 41a is sequentially connected through the wire 19 to the anode terminal of the further right adjacent LED element. The cathode terminal of the LED element 41a mounted on the rightmost side of the group A2 in FIG. 11 is electrically connected through the wire 19 to the dummy element 42 mounted at a right side of the group A2 in FIG. 11, and the dummy element 42 is connected through the wire 19 to the electrode 32c. With the connection, the five LED elements 41a of the group A2 are serially connected between the electrodes 32b and 32c through the dummy elements 42 mounted on right and left ends of the group A2 by wiring between the LED elements.

Because the group A3 is connected similarly to the group 2, the five LED elements 41a of the group A3 also are serially connected between the electrodes 32b and 32c through the dummy elements 42 mounted at right and left ends of the group A2 by wiring between the LED elements.

The groups B1 and B2 of the block B are connected similarly to the groups A2 and A3 of the block A. Therefore, the five LED elements 41b of each of the groups B2 and B3 also are serially connected between the electrodes 32b and 32c through the dummy elements 42 mounted at right and left ends of each of the groups B1 and B2. Because the group B3 has a short length between the electrodes 32b and 32a similarly to the group A1, they are connected without relaying the dummy element 42, the five LED elements 41b of the group B3 are serially connected between the electrodes 32b and 32a.

In this way, the three groups A1, A2 and A3 of the A block, in each of which the five LED elements are serially connected, are connected parallel between the electrodes 32b and 32c, and the three groups B1, B2 and B3 of the block B, in each of which the five LED elements are serially connected, are connected parallel between the electrodes 32b and 32c. With the connection, the LED element groups of the block A and the LED element groups of the block B are serially connected through the electrode 32b between the electrodes 32c and 32a, that is to say, the electrode terminals 12a and 12b (see FIG. 10). Thereby, when a predetermined drive voltage is applied to the electrode terminals 12a and 12b, approximately a half of the drive voltage is dividedly applied to each of the blocks A and B, all the LED elements 41a and 41b can be lighted.

ESD elements 22a and 22b are connected between the electrodes 32b and 32c, and electrodes 32b and 32a, respectively, to protect the LED elements 41a and 41b of each block from static electricity, similarly to that in the second embodiment.

Next, a function of the dummy elements 42 in the third embodiment is described.

Because the pass-through hole 45 in the third embodiment is the circular shape as mentioned above, the base-mounting area 46 in which the surface of the base 2 is exposed becomes a circular shape. Here, a high reflection treatment configured to be easy to reflect light emitted from the LED elements is provided on a surface of the base 2. Accordingly, when the circular base-mounting area is used, a part of the light emitted from the LED elements is reflected on the surface of the base 2 exposed in the base-mounting area 46, and then the reflected light is emitted from the LED apparatus 40 as emission light having a circular light-emitting pattern because the light-emitting area 21 is approximately the circular shape. Here, when the light-emitting pattern of the emission light is approximately the circular shape, because it is possible to accomplish an easy optical design of a lens gathering the circular emission light and an LED apparatus having excellent light-gathering power, as mentioned above, using the circular base-mounting area 46 causes the LED apparatus to improve to have more high performance.

Therefore, the base-mounting area 46 in the third embodiment is set to have the circular shape as shown in FIG. 11. However, if the dummy elements 42 at the right and left ends of the blocks A and B are not mounted, because each of the LED elements 41a of the rightmost side and the leftmost side of the groups A2 and A3, has a long distance to each of the electrodes 32b and 32c, a long wire is needed for connection of the LED elements and the electrodes, consequently, the wire 19 cannot be used for the connection. If a long wire is used for the connection, the long wire tends to be broken and be easy to generate a short circuit between adjacent wires. Therefore, there are problems that defectiveness significantly increases and reliability becomes low.

On the other hand, if a long wire is not used by increasing the number of the serially connected LED elements of the groups A2 and A3 of the block A, for example, using seven LED elements, and mounting these LED elements 41a instead of the dummy elements 42, the aforementioned problems are solved. However, in this case, because the number of the serially connected LED elements in each block is changed, a drive voltage is concentrated to the group A1 which has a less number of the serially connected LED elements, and therefore there is a problem that the LED elements of the groups A2 and A3 cannot be lighted. The problem occurs even in the block B similarly.

To resolve the problem, the third embodiment has a structure in which the dummy elements 42 instead of the LED elements are mounted in predetermined positions of the base-mounting area at the right and left ends of each of the groups A2 and A3 of the block A and groups B1 and B2 of the block B, each of the groups A2, A3, B1 and B2 having a long distance to the corresponding electrode, and the LED elements are connected through the dummy elements 42 among the electrodes 32a, 32b and 32c. Thereby it is possible to shorten a length of the wire 19 and achieve the circular shape of the base-mounting area 46. By relaying the dummy elements 42, because the same number of serially connected LED elements can be used in the block A and the block B, it is possible to flow approximately an equal drive current in each of the blocks A and B, thereby variation in light intensity between the LED elements can be inhibited.

In this way, mounting the dummy elements is a very important factor to form the circular base-mounting area 46. Because the dummy element 42 is made of the transparent material, it is possible to accomplish an LED apparatus having a high light-emitting efficiency without blocking reflection light on the base 2. Meanwhile, because an operation of the third embodiment, a structure of mounting a radiator, and so on are similar to that in the first embodiment, a description thereof is omitted.

<Fourth Embodiment>

Next, a general structure of an LED apparatus according to a fourth embodiment is described with reference to FIG. 12.

The LED apparatus 50 in the fourth embodiment employs dummy elements to adjust a mounted number of LED elements. In addition, because a basic structure of the LED apparatus in the fourth embodiment is similar to that in the first and second embodiments, identical reference numbers are attached to similar parts to that in the first and second embodiments, a duplicative explanation is partially omitted.

The LED apparatus in the fourth embodiment includes a base 2 made of aluminum or the like having heat-conductivity, an insulative substrate 10 fixed to a surface of the base 2 and made of a thin glass epoxy material or the like, a plurality of LED elements 51 and a plurality of dummy elements 52, which are mounted on a base-mounting area 56 which is mentioned hereinafter, and a frame 14.

The substrate 10 includes three electrodes 32a, 32b and 32c formed by a copper foil covering a large part of the surface of the substrate 10. The electrodes 32c and 32a includes at opposite corner portions thereof electrode terminals 12a and 12b configured to receive a supply of a drive voltage from an outer device, respectively.

The frame 14 has, for example, a ring-like shape, and is fixed to a surface of the substrate 10 at a position adjacent to a central portion thereof, and a circular light-emitting area 21 similar to that in the first and second embodiments is provided inside the frame 14. The base-mounting area 56 is formed by a square pass-through hole 55 provided in the substrate 10 inside the light-emitting area 21, and the plurality of LED elements 51 and the dummy elements 52 are directly mounted on a surface of the base 2 exposed by the pass-through hole 55. A detail of the LED elements 51 and the dummy elements 52 in the light-emitting area 21 is mentioned hereinafter.

The light-emitting area 21 is filled with a light-transmitting sealing member 15 (see FIG. 2) to seal the LED elements 51 and the dummy elements 52 as mentioned above. The sealing member 15 is shown in a manner of transparence to make an inside of the light-emitting area 21 understandable. A white resist is provided on each of the three electrodes 32a, 32b and 32c shown in an area outside the frame 14. The white resist is omitted in FIG. 12. An inner diameter of the frame 14, in other words, a diameter of the light-emitting area 21 is about 11 mm or less than it, as an example, similarly to the first and second embodiments. Because mounting parts 16a and 16b and so on to mount a radiator is similar to that in the first embodiment, a description thereof is omitted.

Next, a detail of the light-emitting area 21 in the fourth embodiment is described with reference to FIG. 13.

Figure 12:
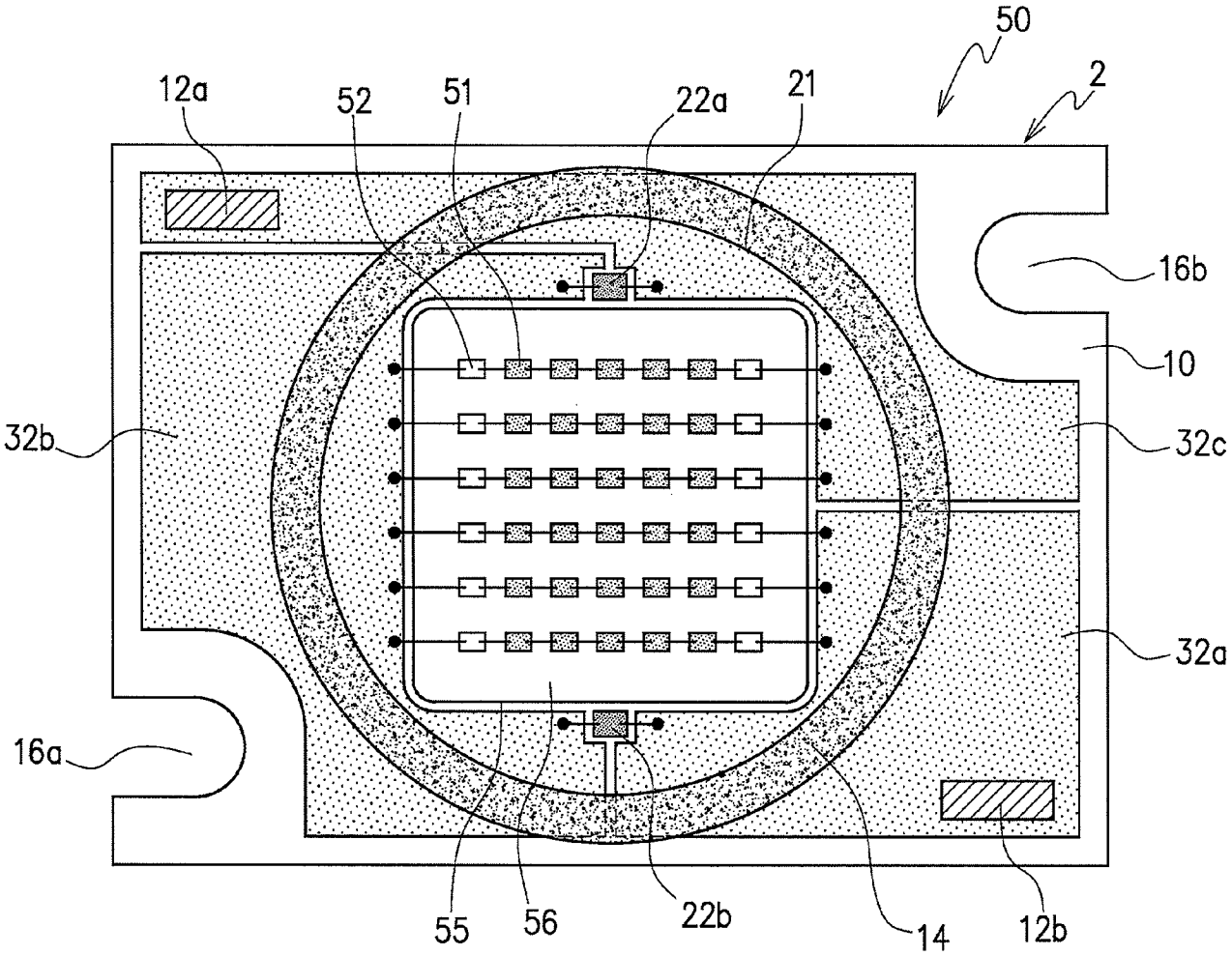
FIG. 12 is a plan view of an LED apparatus according to a fourth embodiment of the present invention.
Figure 13:
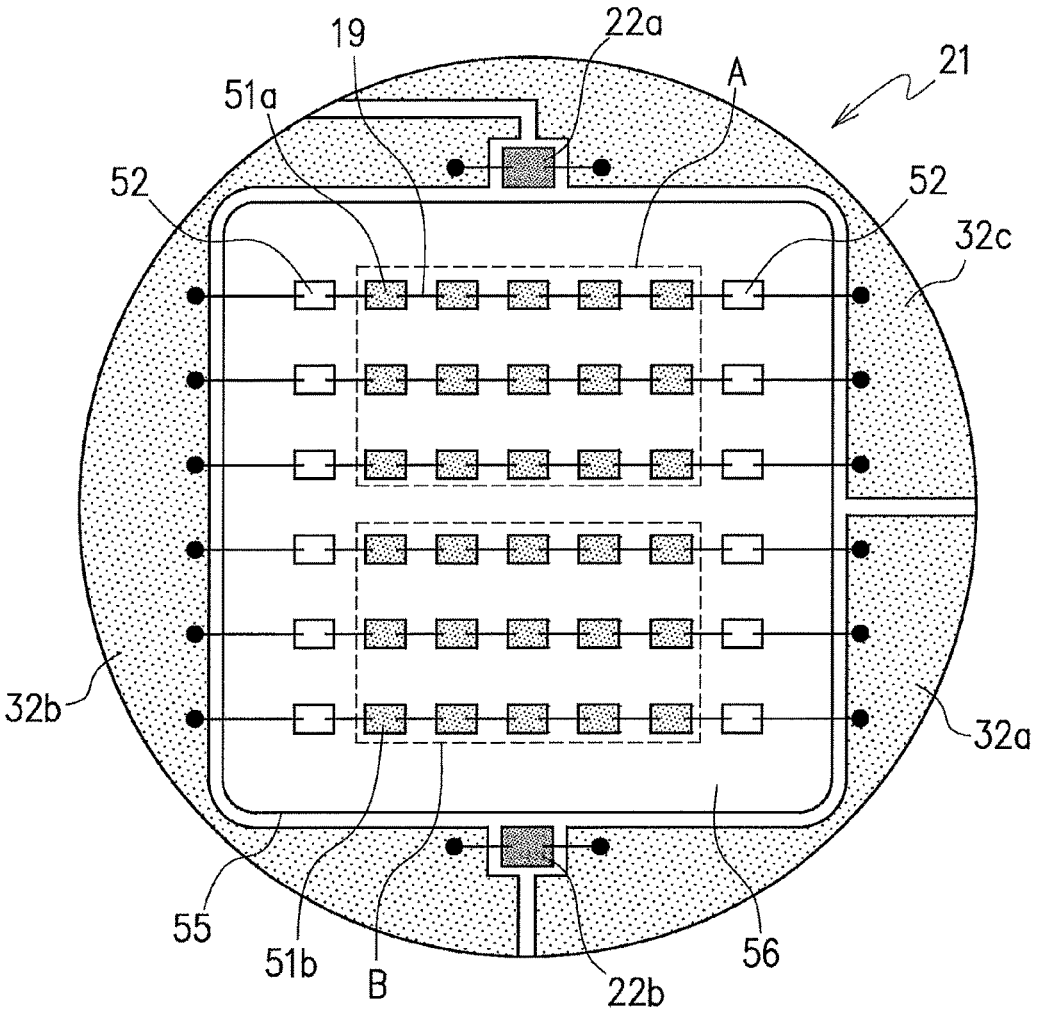
FIG. 13 is an enlarged plan view of a light-emitting area of the LED apparatus according to the fourth embodiment of the present invention.

As shown in FIG. 13, the light-emitting area 21 in the fourth embodiment has the circular shape, and is surrounded by the frame 14 (see FIG. 12). As mentioned above, the substrate 10 inside the light-emitting area 21 is provided with the square pass-through hole 55 by which the surface of the base 2 is exposed, and thereby the square base-mounting area 56 is formed. That is to say, the base-mounting area 56 is an area positioned inside the light-emitting area 21 and where the surface of the base 2 is exposed.

A part of the electrode 32b is formed at a left side in FIG. 13 inside the light-emitting area 21 to cover a portion adjacent to a left side of the pass-through hole 55, a part of the electrode 32a is formed at a lower right side in FIG. 13 inside the light-emitting area 21 to cover a portion adjacent to a lower right side of the pass-through hole 55, and a part of the electrode 32c is formed at an upper right side in FIG. 13 inside the light-emitting area 21 to cover a portion adjacent to an upper right side of the pass-through hole 55.

The plurality of LED elements 51 are mounted on the base-mounting area 56 in which the surface of the base 2 is exposed, as shown in FIGS. 12 and 13. In this case, in FIG. 13, an upper portion of approximately a central portion of the base-mounting area 56 is defined as a block A (portion surround by a dashed line), and a lower portion of the central portion of the base-mounting area 56 is defined as a block B (portion surround by a dashed line). In addition, LED elements mounted in the block A are defined as first LED elements 51a, and LED elements mounted in the block B are defined as second LED elements 51b.

The LED elements 51a mounted in the block A are mounted in three groups in each of which five laterally arranged LED elements are serially connected are connected longitudinally in parallel (5 series-3 parallel group), and the LED elements 51b mounted in the block B are similarly mounted in three groups in each of which five laterally arranged LED elements are serially connected are connected longitudinally in parallel (5 series-3 parallel group), totally thirty (30) LED elements are mounted.

Meanwhile, the number of the LED elements is not limited to the aforementioned embodiment, and the number is decided based on specifications of an optical device.

On the other hand, three dummy elements 52 are mounted longitudinally at each of right and left ends of the block A, as shown in FIG. 13, and three dummy elements 52 are mounted longitudinally at each of right and left ends of the block B. Each of the dummy elements 42 is preferably is made of a transparent material having thermal conductivity, for example, sapphire, silicon-carbide, or the like, and has a size similar to the LED elements 51a and 51b.

Next, a, electrical connection of the LED elements and the dummy elements is explained.

Here, the LED elements 51a of the block A mounted in the base-mounting area 56 are arranged so that anode terminals (not shown) are disposed in a left side in FIG. 12 and cathode terminals (not shown) are disposed in a right side in FIG. 12, as an example, and the LED elements 51b of the block B mounted in the base-mounting area 56 are arranged so that anode terminals (not shown) are disposed in a right side in FIG. 12 and cathode terminals (not shown) are disposed in a left side in FIG. 12, as an example. All the LED elements 51a, 51b and the dummy elements 52 are electrically connected through wires 19 which are, for example, metallic thin lines by a wire bonder (not shown).

Here, the three dummy elements 52 are mounted longitudinally at the left side of the block A in FIG. 12 as mentioned above, and each of the dummy elements 52 is electrically connected at a left side thereof through a wire 19 to the electrode 32b and at a right side thereof through the wire 19 to the anode terminal of each of three LED elements 51a mounted at the leftmost side of the block A in FIG. 12. The cathode terminal of the LED element 51a is directly connected through the wire 19 to the anode terminal of the right adjacent LED element in FIG. 12.

Similarly, the cathode terminal of the right adjacent LED element 51a is sequentially connected through the wire 19 to the anode terminal of the further right adjacent LED 51a element in FIG. 12. The cathode terminal of the LED element 51a mounted on the rightmost side of the group A2 in FIG. 12 is electrically connected through the wire 19 to the dummy element 52 mounted at a right side of the group A2 in FIG. 12, and the dummy element 52 is connected through the wire 19 to the electrode 32c. In this way, the LED elements 51a of the 5 series-3 parallel group of the block A are connected between the electrodes 32b and 32c through the dummy elements 52 mounted on the right and left ends of the block A.

The LED elements 51b of the block B also are connected similarly to the block A. Therefore, the LED elements 51b of the 5 series-3 parallel group of the block B are connected between the electrodes 32b and 32a through the dummy elements 52 mounted at the right and left sides of the block B.

In this way, the LED elements 51a of the 5 series-3 parallel group of the block A are connected between the electrodes 32b and 32c, and the LED elements 51b of the 5 series-3 parallel group of the block B are connected between the electrodes 32b and 32a. With the connection, the LED element groups of the block A and the LED element groups of the block B are serially connected through the electrode 32b between the electrodes 32c and 32a, that is to say, the electrode terminals 12a and 12b (see FIG. 12). Thereby, when a predetermined drive voltage is applied to the electrode terminals 12a and 12b, approximately a half of the drive voltage is dividedly applied to each of the blocks A and B, all the LED elements 51a and 51b can be lighted.

ESD elements 22a and 22b are connected between the electrodes 32b and 32c, and electrodes 32b and 32a, respectively, to protect the LED elements 51a and 51b of each block from static electricity, similarly to that in the second embodiment.

Next, a function of the dummy elements 52 in the fourth embodiment is explained.

An object of the present invention is to achieve an LED apparatus having a high lumen-density by mounting a large number of LED elements on as small light-emitting area as possible. However, in the LED apparatus, a requested light intensity often differs depending on purpose of use. In this case, by preparing packages of LED apparatuses in which several types of substrates having base-mounting areas of different sizes are manufactured, the number of LED elements in LED apparatuses differs, it is considered to exchange an appropriate package of the prepared packages depending on requested specifications. However, preparing several packages and exchanging a package cause some problems such as reduction of manufacturing efficiency of LED apparatuses, complication of stock management of LED apparatuses, and increment in manufacturing costs of LED apparatuses.

When the dummy elements 52 as shown in the fourth embodiment are used, because the mounted number of the LED elements in the blocks A and B can be adjusted without exchanging the package, it is possible to achieve easily an LED apparatus emitting light intensity depending on requested specifications. For example, if an LED apparatus having light intensity higher than that of the LED apparatus in the fourth embodiment is manufactured, LED elements may be substituted for the dummy elements 52 mounted at the right and left ends of each of the blocks A and B. In this case, in the blocks A and B, LED elements of a seven-series-three parallel group can be mounted, thereby it is possible to increase light intensity of the LED apparatus depending on specifications without exchanging the package (changing a size of the base-mounting area 56). Alternatively, if an LED apparatus having light intensity lower than that of the LED apparatus in the fourth embodiment is manufactured, the number of dummy elements 52 may be increased, for example, to be double, totally, twenty four (24) by substituting them for the LED elements 51a and 51b mounted on the rightmost and leftmost sides of the blocks A and B. That is to say, two dummy elements 52 are serially connected at right and left ends of each of the serially arranged LED elements in each of the blocks A and B, by wiring. Thereby, because the blocks A and B together have LED elements of a three-series-three parallel group, it is possible to reduce light intensity of the LED apparatus depending on specifications without exchanging the package.

In this way, because the LED apparatus in the fourth embodiment can accomplish easily an LED apparatus capable of emitting different light intensity by changing the mounted number of the dummy elements, it is possible to provide effectively an LED apparatus capable of corresponding to different requested specifications.

<Fifth Embodiment>

Figure 14:
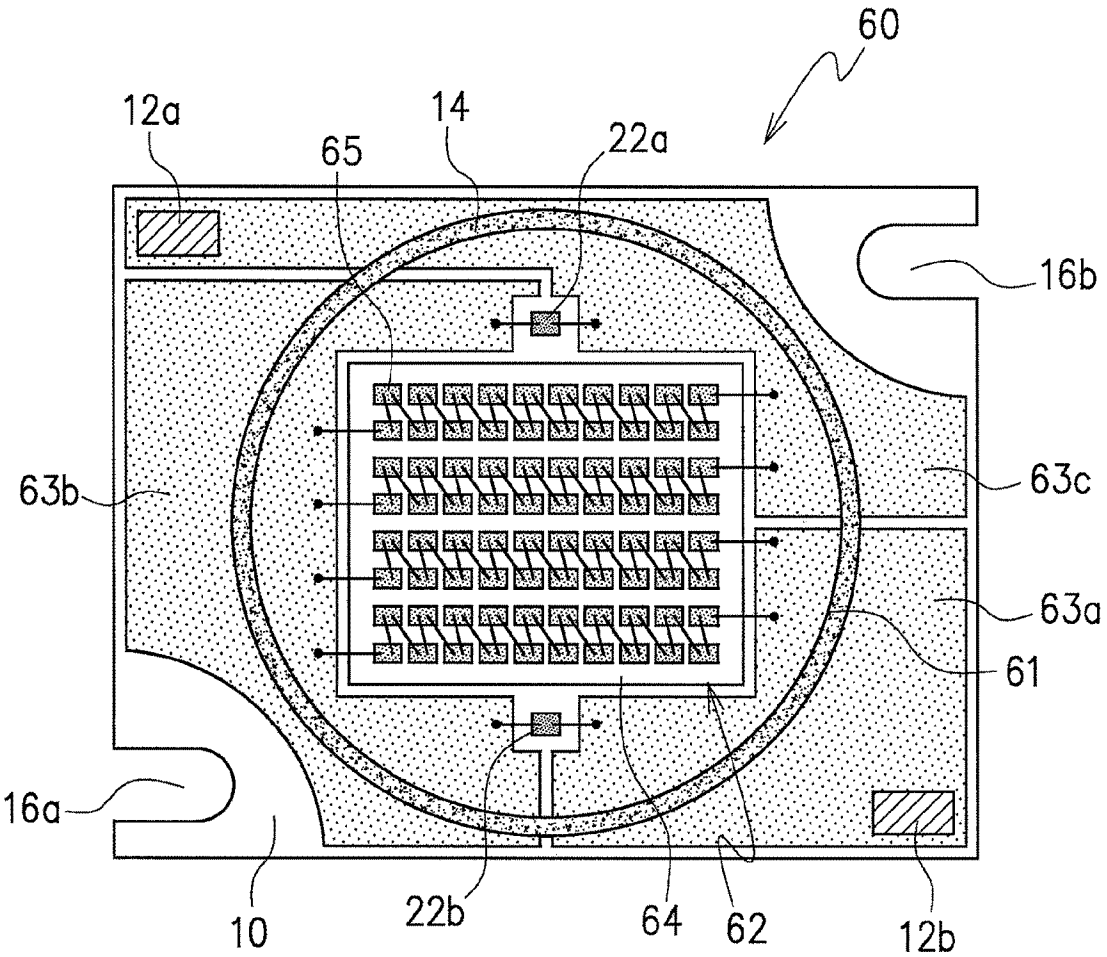
FIG. 14 is a plan view of an LED apparatus according to a fifth embodiment of the present invention.

Next, an LED apparatus according to a fifth embodiment of the present invention is schematically described with reference to FIG. 14.

Because a basic structure of the LED apparatus 60 in the fifth embodiment is similar to that in the first and second embodiments, identical reference numbers are attached to similar parts to that in the first and second embodiments, a duplicative description is partially omitted.

The LED apparatus 60 in the fifth embodiment includes a conductive base 2 (see FIG. 2), an insulative substrate 10 including a surface on which three electrodes 63a, 63b and 63c are provided, and a light-emitting area 61 provided on the substrate. A base-mounting area having approximately a square shape is provided inside the light-emitting area 61. The base-mounting area 62 is formed by a pass-through hole 64 which is provided to pass through the electrodes 63a, 63b and 63c and the substrate 10 and configured to expose a surface of the base 2, similarly to the first to fourth embodiments. The pass-through hole 64 has, for example, a rectangular shape. A plurality of LED elements 65 are arranged in the base-mounting area 62. These LED elements 65 are mounted in a series set and a parallel set. The series set comprises two arrays in each of which ten (10) laterally arranged LED elements, and thereby twenty (20) LED elements are totally arranged in the two arrays. The LED elements in the two arrays are serially connected, as shown in FIG. 14. The parallel set comprises four series sets which are longitudinally arranged. The four series sets are connected to the electrodes 63b and 63c, 63b and 63a, thereby the four series set are connected parallel.

Figure 15:
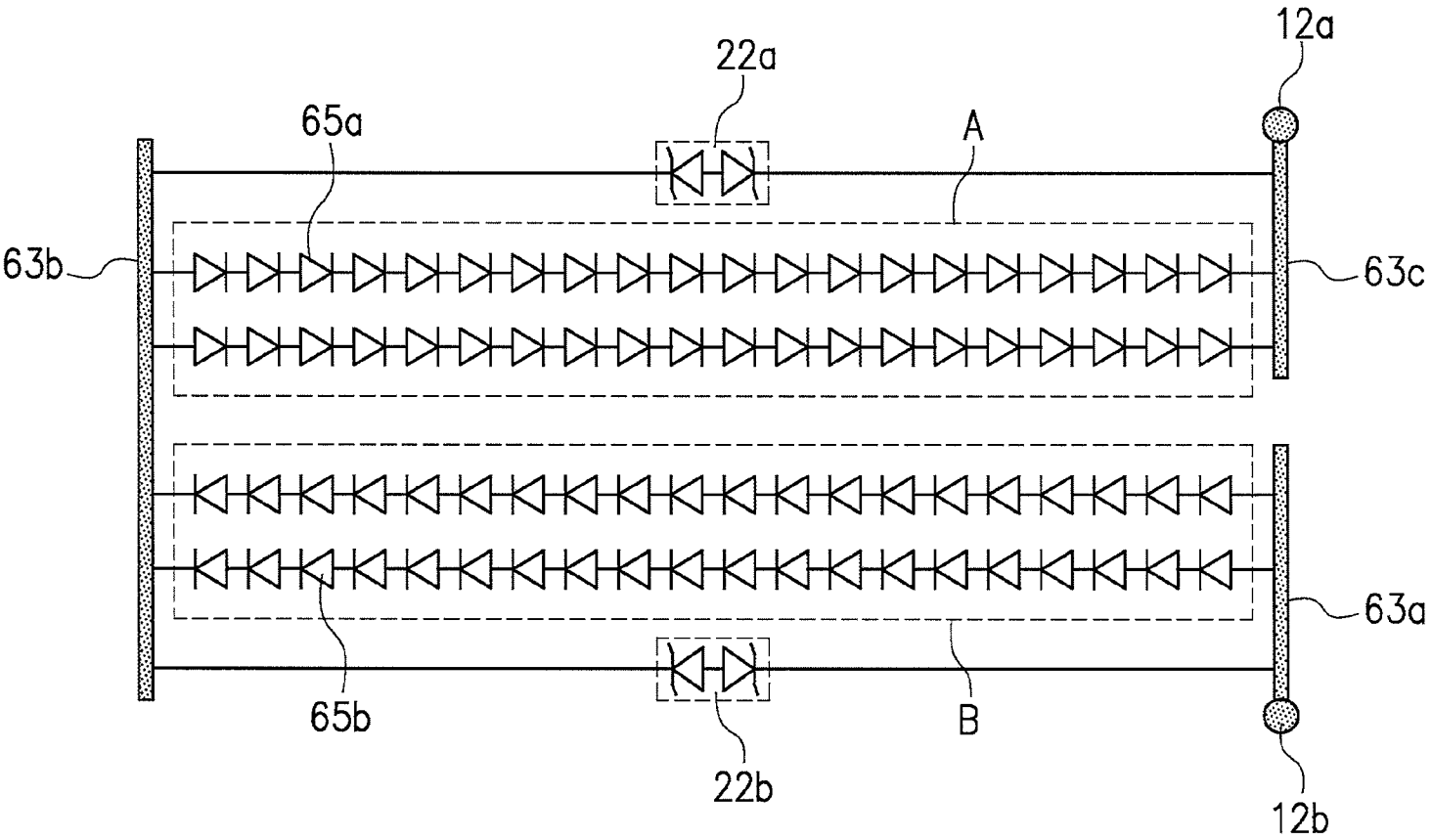
FIG. 15 is a view for explaining a circuit in which LED elements in the LED apparatus according to the fifth embodiment of the present invention are connected.

FIG. 15 illustrates a detail of a connection circuit of the LED elements in the fifth embodiment.

Forty (40) LED elements 65a are arranged in a block A, and forty (40) LED elements 65b are arranged in a block B, thereby totally eighty (80) LED elements are mounted in the blocks A and B. More specifically, in the block A, two groups in each of which the twenty (20) LED elements 65a are serially connected are connected parallel between the electrodes 63b and 63c. In the block B, two groups in each of which the twenty (20) LED elements 65b are serially connected are connected parallel between the electrodes 63b and 63a.

With the connection, the LED element groups in the blocks A and B are serially connected between the electrodes 63c and 63a, that is to say, electrode terminals 12a and 12b, through the electrode 63b.

Thereby, when a predetermined drive voltage is applied to the electrode terminals 12a and 12b, about a half of the applied drive voltage is separately applied to the blocks A and B, all the LED elements 65a and 65b can be lighted. Moreover, because a large number of LED elements are serially connected in each of the blocks A and B, it is possible absorb variation in characteristic of individual LED elements 65a and 65b. Furthermore, because the groups in each block are connected parallel, it is possible to prevent the drive voltage from becoming a high pressure.

In addition, because the blocks A and B are serially connected, an equal drive current flow in each of the blocks, and therefore equal light intensity is emitted from the blocks A and B. Thereby, even if a large number of LED elements are mounted, it is possible to provide an LED apparatus having less variation in light intensity every the LED element.

<Sixth Embodiment>

Figure 16:
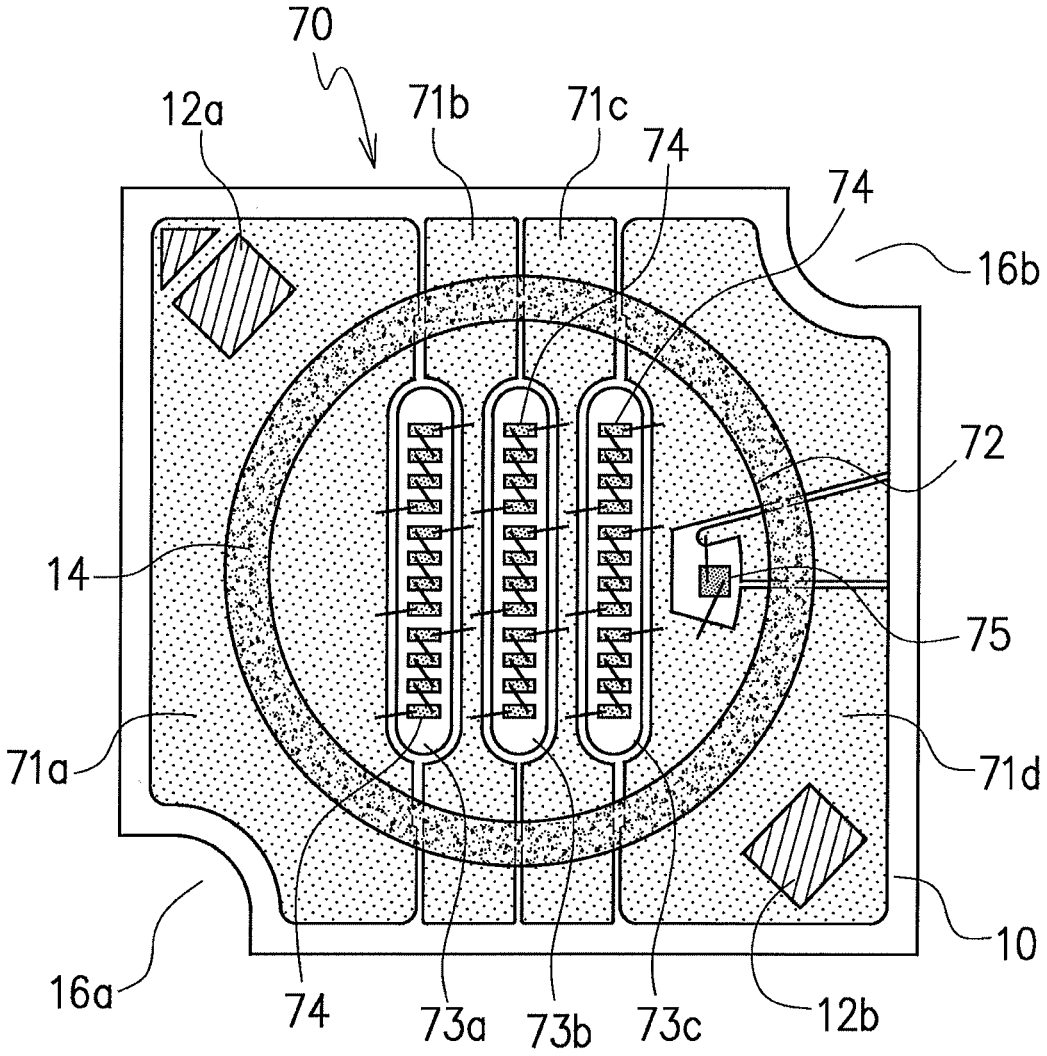
FIG. 16 is a plan view of an LED apparatus according to a sixth embodiment of the present invention.

Next, an LED apparatus according to a sixth embodiment of the present invention is schematically described with reference to FIG. 16.

Because a basic structure of the LED apparatus 70 in the sixth embodiment is similar to that in the aforementioned first and second embodiments, identical reference numbers are attached to similar parts to that in the first and second embodiments, a duplicative description is partially omitted. The plurality of elongate pass-through holes of this embodiment provided parallel with each other with an interval disposed between a pair of the pass-through holes that are juxtaposed to each other. Of the electrodes, one being disposed independently between the pair of the elongate pass-through holes that are juxtaposed to each other and extended in a length direction of the elongate pass-through holes that are parallel with each other. Of the plurality of light-emitting diode elements, at least two of the light-emitting diode elements are lined in the length direction of each of the elongate pass-through holes as a unit of the light-emitting diode elements in series. A plurality of the units of the light-emitting elements are provided in each of the elongate pass-through holes, and the at least two of the light-emitting diode elements in each of the units are electrically in series to the two electrodes that are disposed at opposite sides of the each corresponding pass-through hole.

The LED apparatus 70 in the sixth embodiment includes a conductive base 2 (see FIG. 2), an insulative substrate 10 mounted on the base 2, and a light-emitting area 72 provided on the substrate 10. Four electrodes 71a, 71b, 71c and 71d are provided on a surface of the substrate 10. For example, three base-mounting areas 73a, 73b and 73c are provided inside the light-emitting area 72. Each of the base-mounting areas 73a, 73b and 73c has, for example, an elongate rectangular shape and formed by a pass-through hole provided to pass through the substrate 10 to expose a surface of the base 2, similarly to the first to fourth embodiments. Electrodes 71a, 71b, 71c and 71d are respectively disposed along opposite sides of each pass-through hole.

A plurality of LED elements 74 are arranged in each of the base-mounting areas 73a, 73b and 73c. Three sets of LED elements are arranged in each of the base-mounting areas 73a, 73b and 73c along a length direction of the pass-through hole. Each of the three sets constitutes a unit in which four LED elements are serially connected. Consequently, totally twelve LED elements are arranged in each of the base-mounting areas. The units in each of which the four LED elements are serially are connected to the corresponding both electrodes, thereby the units are connected parallel. More specifically, the plurality of units of the LED elements in the base-mounting area 73a are connected between the electrodes 71a and 71b, the plurality of units of the LED elements in the base-mounting area 73b are connected between the electrodes 71b and 71c, and the plurality of units of the LED elements in the base-mounting area 73c are connected between the electrodes 71c and 71d. With the connection, the three units of LED elements connected parallel in each base-mounting area are connected parallel among the base-mounting areas 73a, 73b and 73c. Here, reference number 75 shows an ESD element.

Figure 17:
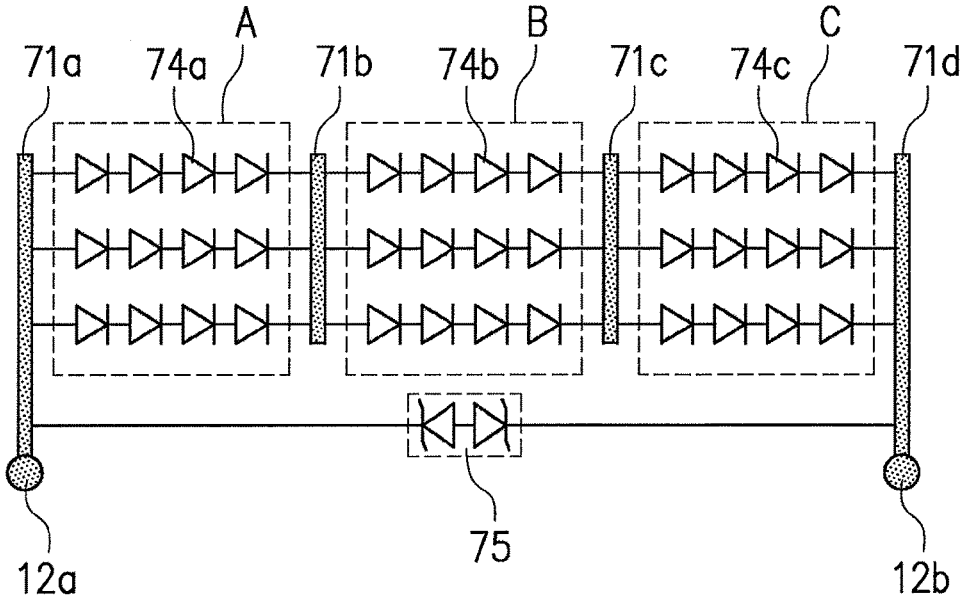
FIG. 17 is a view for explaining a circuit in which LED elements in the LED apparatus according to the sixth embodiment of the present invention are connected.
Figure 18:
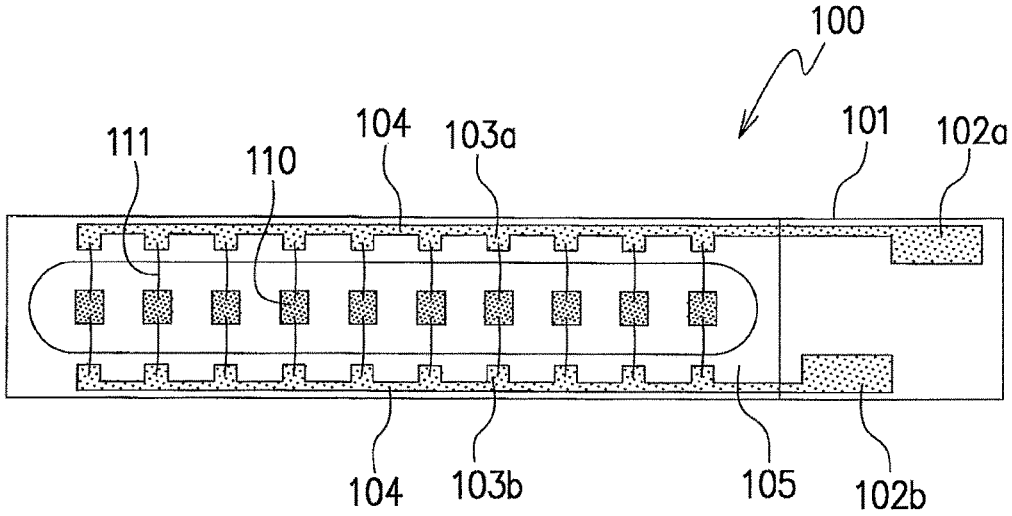
Fig. 18 (Prior Art)
FIG. 18 is a plan view of a conventional LED light-source unit.

FIG. 17 illustrates a detail of a connection circuit of the LED elements in the sixth embodiment.

The LED apparatus includes three blocks A, B and C, as shown in FIG. 17. Twelve LED elements 74a are arranged in the block A between the electrodes 71a and 71b, the twelve LED elements 74b are arranged in the block B between the electrodes 71b and 71c and the twelve LED elements 74c are arranged in the block C between the electrodes 71c and 71d. Each of the twelve LED elements 74a, 74b and 74c constitutes a series set in which four (4) LED elements are serially connected and a parallel set in which three (3) series sets are connected parallel. Consequently, thirty six (36) LED elements are totally mounted in the blocks A, B and C.

With the connection, the LED element groups in the blocks A, B and C are serially connected between the electrodes 71a and 71d, that is to say, electrode terminals 12a and 12b, through the electrodes 71b and 71c.

Thereby, when a predetermined drive voltage is applied to the electrode terminals 12a and 12b, about ⅓ of the applied drive voltage is separately applied to the blocks A, B and C, all the LED elements 74a, 74b and 74c can be lighted. Moreover, because the three series sets in each of which the four (4) LED elements are serially connected are connected parallel, in each of the blocks A, B and C, it is possible to absorb variation in characteristic of individual LED elements 74a, 74b and 74c. In addition, because the blocks A, B and C are serially connected, an equal drive current flow in each of the blocks, and therefore equal light intensity is emitted from each of the LED elements in the blocks A, B and C. Thereby, even if a large number of LED elements are mounted, it is possible to provide an LED apparatus having less variation in light intensity every the LED element.

As mentioned above, in the LED apparatus according to each of the first to sixth embodiments, because LED elements can be mounted in a high density, it is possible to reduces a size of a light-emitting area, and provide an LED apparatus having high lumen-density. In addition, because more large number of LED elements can be mounted even in the light-emitting area of the same size, it is possible to provide an LED apparatus having high output and high brightness. Furthermore, because the light-emitting area has approximately a circular shape, light emitted from the LED elements mounted in the light-emitting area is reflected in the light-emitting area and emitted with approximately a circular light-emitting pattern from the LED apparatus. Thereby, it is possible to accomplish a compact LED apparatus having good directionality of emitted light, easy optical design of a lens to gather emitted light, and high performance.

In addition, because a large number of LED elements can be mounted in a light-emitting area of a narrow area, an LED apparatus having high lumen-density can be provided. Thereby, because it is possible to accomplish a compact LED apparatus having good directionality of emitted light, easy optical design for a lens to gather emitted light, and high output and brightness, the LED apparatus can be applied to illumination devices of various uses.

Moreover, because the light-emitting area has approximately a circular shape and is surrounded by a frame, light emitted from the LED elements mounted in the light-emitting area is reflected in the light-emitting area and emitted with approximately a circular light-emitting pattern from the LED apparatus. Thereby, it is possible to accomplish a compact LED apparatus having good directionality of emitted light, easy optical design for a lens to gather emitted light, and high performance.

Furthermore, by grouping a large number of LED elements in a predetermined number and mixing a series connection and a parallel connection, it is possible to prevent a drive voltage from becoming a high pressure and inhibiting variation in light-emission of individual LED elements. In addition, because LED elements are directly mounted on a base having excellent thermal conductivity and the base can be attached easily to an outer radiator, a light source device having excellent heat-release efficiency can be achieved, thereby it is possible to provide an LED apparatus capable of inhibiting temperature elevation and having a long service life and excellent reliability.

Although the preferred embodiments of the present invention have been described, it should be understood that the present invention is not limited to these embodiments, various changes and modifications can be made to the embodiments.

Meanwhile, because the present invention makes it possible to provide an LED apparatus having high lumen-density by an easy design, it is possible to widely apply to usual light sources fir illumination, backlights, in-vehicle light sources or the like as light sources for illumination.

What is claimed is:

[1. A light-emitting diode apparatus, comprising:

a base including an upper surface, a lower surface opposite the upper surface and a peripheral edge side surface provided between the upper surface and the lower surface and having thermal conductivity;

an insulative substrate including an upper surface provided with electrodes, a lower surface opposite the upper surface and a pass-through hole provided to pass through the upper surface and the lower surface, the lower surface of the insulative substrate being attached to the upper surface of the base, and the electrodes being along opposite sides of the pass-through hole;

at least one base-mounting area that is exposed part of the upper surface of the base, exposed within the pass-through hole of the substrate;

a plurality of light-emitting diode elements mounted on the base-mounting area and electrically connected to the electrodes which are provided along opposite sides of the pass-through hole; and a frame disposed to surround the base-mounting area and configured to form a light-emitting area.]

2. A light-emitting diode apparatus, comprising:

a base including an upper surface, a lower surface opposite the upper surface and a peripheral edge side surface provided between the upper surface and the lower surface and having thermal conductivity;

an insulative substrate including an upper surface provided with electrodes, a lower surface opposite the upper surface and a plurality of elongate pass-through holes provided parallel with each other to pass through the upper surface and the lower surface, the lower surface of the insulative substrate being attached to the upper surface of the base, and the electrodes being along opposite sides of each of the elongated pass-through holes;

a plurality of base-mounting areas that are exposed parts of the upper surface of the base, exposed within the plurality of pass-through holes of the substrate;

a plurality of light-emitting diode elements mounted on each of the plurality of base-mounting areas;

a frame disposed to surround the plurality of base-mounting areas and configured to form a light-emitting area; and the plurality of elongate pass-through holes of the substrate being extended parallel with each other with an interval disposed between a pair of the pass-through holes that are juxtaposed to each other, one of the electrodes being disposed independently between the pair of the elongate pass-through holes that are juxtaposed to each other and extended in a length direction of the elongate pass-through holes that are parallel with each other,

*wherein the frame includes a material in which silicone is mixed with oxide titan.*

[3. The light-emitting diode apparatus according to claim 2, wherein the electrodes are disposed at opposite outer sides of the parallel elongate pass-through holes, respectively, the opposite outer sides positioned in a width direction perpendicular to the length direction of the parallel elongate pass-through holes, wherein, of the light-emitting diode elements, at least two light-emitting diode elements that are arranged in the width direction of each of the elongate pass-through holes and electrically connected in series to two electrodes that are disposed at opposite sides of the corresponding elongate pass-through hole, and the at least two light-emitting diode elements are electrically connected in series as a unit of the light-emitting diode elements in series.]

[4. The light-emitting diode apparatus according to claim 3, wherein a plurality of the units of the light-emitting diode elements that are electrically connected in series are provided in each of the elongate pass-through holes, and the units are disposed parallel with each other in a length direction of the corresponding elongate pass-through hole and electrically connected in parallel to the two electrodes that are disposed at opposite sides of the corresponding elongate pass-through hole.]

[5. The light-emitting diode apparatus according to claim 3, wherein, in the unit of the light-emitting diode elements in series, the light-emitting diode elements are directly wired by a metallic thin line.]

[6. The light-emitting diode apparatus according to claim 2, wherein the electrodes are disposed at opposite outer sides of the parallel elongate pass-through holes, respectively, and the opposite outer sides are positioned in a width direction perpendicular to the length direction of the parallel elongate pass-through holes, wherein, of the plurality of light-emitting diode elements, at least two of the light-emitting diode elements are lined in the length direction of each of the elongate pass-through holes as a unit of the light-emitting diode elements in series, wherein a plurality of the units of the light-emitting diode elements are provided in each of the elongate pass-through holes, and the at least two of the light-emitting diode elements in each of the units are electrically in series connected to the two electrodes that are disposed at opposite sides of the each corresponding pass-through hole.]

[7. The light-emitting diode apparatus according to claim 6, wherein a connection among the plurality of units is made through the electrodes.]

[8. The light-emitting diode apparatus according to claim 6, wherein a connection among the plurality of light-emitting diode elements in each unit is directed wired by a metallic thin line.]

[9. The light-emitting diode apparatus according to claim 1, wherein some of the plurality of light-emitting diodes are connected to conductive dummy elements.]

[10. The light-emitting diode apparatus according to claim 2, wherein some of the plurality of light-emitting diodes are connected to conductive dummy elements.]

[11. The light-emitting diode apparatus according to claim 1, wherein the base-mounting area has a shape selected among a rectangular shape, a square shape and a circular shape.]

[12. The light-emitting diode apparatus according to claim 2, wherein each of the base-mounting areas has a shape selected among an elongate rectangular shape and an elongate circular shape.]

[13. The light-emitting diode apparatus according to claim 1, wherein the light-emitting area inside the frame is sealed by a light-transmitting sealing member.]

[14. The light-emitting diode apparatus according to claim 2, wherein the light-emitting area inside the frame is sealed by a light-transmitting sealing member.]

[15. The light-emitting diode apparatus according to claim 1, wherein a radiator configured to increase heat-release efficiency is attached to the lower surface of the base.]

[16. The light-emitting diode apparatus according to claim 2, wherein a radiator configured to increase heat-release efficiency is attached to the lower surface of the base.]

[17. The light-emitting diode apparatus according to claim 1, wherein, in the plurality of light-emitting diode elements, at least two light-emitting diode elements that are extended in a line between the electrodes that are provided along opposite sides of the pass-through hole, and electrically connected in series as a unit of light-emitting diode elements in series, wherein a plurality of the units of light-emitting diode elements in series are arranged parallel with each other in a direction perpendicular to the line of the at least two light-emitting diode elements as the unit, wherein the units are electrically connected to the electrodes in parallel.]

*18. The light-emitting diode apparatus according to claim 2, wherein a connection among the plurality of units is made through the electrodes.*

*19. The light-emitting diode apparatus according to claim 2, wherein a connection among the plurality of light-emitting diode elements in each unit is directly wired by a metallic thin line.*

*20. The light-emitting diode apparatus according to claim 2, wherein each of the base-mounting areas has a shape selected among an elongate rectangular shape and an elongate circular shape.*

*21. The light-emitting diode apparatus according to claim 2, wherein the light-emitting area inside the frame is sealed by a light-transmitting sealing member.*

*22. A light-emitting diode apparatus, comprising:*

*a base including an upper surface, a lower surface opposite the upper surface and a peripheral edge side surface provided between the upper surface and the lower surface and having thermal conductivity;*

*an insulative substrate including an upper surface provided with electrodes, a lower surface opposite the upper surface and a plurality of elongate pass-through holes provided parallel with each other to pass through the upper surface and the lower surface, the lower surface of the insulative substrate being attached to the upper surface of the base, and the electrodes being along opposite sides of each of the elongated pass-through holes;*

*a plurality of base-mounting areas that are exposed parts of the upper surface of the base, exposed within the plurality of pass-through holes of the substrate;*

*a plurality of light-emitting diode elements mounted on each of the plurality of base-mounting areas;*

*a frame disposed to surround the plurality of base-mounting areas and configured to form a light-emitting area; and*

*the plurality of elongate pass-through holes of the substrate being extended parallel with each other with an interval disposed between a pair of the pass-through holes that are juxtaposed to each other, one of the electrodes being disposed independently between the pair of the elongate pass-through holes that are juxtaposed to each other and extended in a length direction of the elongate pass-through holes that are parallel with each other,*

*wherein the plurality of light-emitting diodes are divided into a plurality of units, each of units includes a plurality of light-emitting diode elements electrically connected in series, and the plurality of units are electrically connected between the electrodes so that the plurality of units are arranged parallel.*

*23. The light-emitting diode apparatus according to claim 22, wherein a connection among the plurality of units is made through the electrodes.*

*24. The light-emitting diode apparatus according to claim 22, wherein a connection among the plurality of light-emitting diode elements in each unit is directly wired by a metallic thin line.*

*25. The light-emitting diode apparatus according to claim 22, wherein each of the base-mounting areas has a shape selected among an elongate rectangular shape and an elongate circular shape.*

*26. The light-emitting diode apparatus according to claim 22, wherein the light-emitting area inside the frame is sealed by a light-transmitting sealing member.*

*27. A light-emitting diode apparatus, comprising:*

*a base including an upper surface, a lower surface opposite the upper surface and a peripheral edge side surface provided between the upper surface and the lower surface and having thermal conductivity;*

*an insulative substrate including an upper surface provided with electrodes, a lower surface opposite the upper surface and a plurality of elongate pass-through holes provided parallel with each other to pass through*

*the upper surface and the lower surface, the lower surface of the insulative substrate being attached to the upper surface of the base, and the electrodes being along opposite sides of each of the elongated pass-through holes;*

*a plurality of base-mounting areas that are exposed parts of the upper surface of the base, exposed within the plurality of pass-through holes of the substrate;*

*a plurality of light-emitting diode elements mounted on each of the plurality of base-mounting areas;*

*a frame disposed to surround the plurality of base-mounting areas and configured to form a light-emitting area; and*

*the plurality of elongate pass-through holes of the substrate being extended parallel with each other with an interval disposed between a pair of the pass-through holes that are juxtaposed to each other, one of the electrodes being disposed independently between the pair of the elongate pass-through holes that are juxtaposed to each other and extended in a length direction of the elongate pass-through holes that are parallel with each other,*

*wherein the frame includes a material in which silicone is mixed with oxide titan, and*

*wherein the plurality of light-emitting diodes are divided into a plurality of units, each of units includes a plurality of light-emitting diode elements electrically connected in series, and the plurality of units are electrically connected between the electrodes so that the plurality of units are arranged parallel.*

*28. The light-emitting diode apparatus according to claim 27, wherein a connection among the plurality of units is made through the electrodes.*

*29. The light-emitting diode apparatus according to claim 27, wherein a connection among the plurality of light-emitting diode elements in each unit is directly wired by a metallic thin line.*

*30. The light-emitting diode apparatus according to claim 27, wherein each of the base-mounting areas has a shape selected among an elongate rectangular shape and an elongate circular shape.*

*31. The light-emitting diode apparatus according to claim 27, wherein the light-emitting area inside the frame is sealed by a light-transmitting sealing member.*

* * * * *